(12) United States Patent
Lo et al.

(10) Patent No.: US 11,706,569 B2
(45) Date of Patent: Jul. 18, 2023

(54) SOUND PRODUCING CELL AND MANUFACTURING METHOD THEREOF

(71) Applicant: xMEMS Labs, Inc., Santa Clara, CA (US)

(72) Inventors: Chiung C. Lo, San Jose, CA (US); Hao-Hsin Chang, New Taipei (TW); Wen-Chien Chen, New Taipei (TW); Chun-I Chang, Hsinchu County (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/048,047

(22) Filed: Oct. 20, 2022

(65) Prior Publication Data

US 2023/0073046 A1 Mar. 9, 2023

Related U.S. Application Data

(62) Division of application No. 17/720,333, filed on Apr. 14, 2022.

(60) Provisional application No. 63/187,357, filed on May 11, 2021.

(51) Int. Cl.
| | |
|---|---|
| *H04R 25/00* | (2006.01) |
| *H04R 7/06* | (2006.01) |
| *H04R 7/18* | (2006.01) |
| *H04R 31/00* | (2006.01) |

(52) U.S. Cl.
CPC ............... *H04R 7/06* (2013.01); *H04R 7/18* (2013.01); *H04R 31/003* (2013.01); *B81B 2203/01* (2013.01); *B81B 2203/0307* (2013.01)

(58) Field of Classification Search
CPC ...... H04R 7/18; H04R 47/06; B81B 2203/01; B81B 2203/0307
USPC .......................................................... 381/150
See application file for complete search history.

(56) References Cited

U.S. PATENT DOCUMENTS

| | | | |
|---|---|---|---|
| 11,350,217 B2 | 5/2022 | Stoppel | |
| 2013/0018218 A1* | 1/2013 | Haller | H04R 25/60 600/25 |
| 2014/0121449 A1* | 5/2014 | Kasic | H04R 25/606 600/25 |
| 2014/0121450 A1* | 5/2014 | Kasic | H04R 25/60 600/25 |
| 2020/0100033 A1 | 3/2020 | Stoppel | |

\* cited by examiner

*Primary Examiner* — Phylesha Dabney
(74) *Attorney, Agent, or Firm* — Winston Hsu

(57) ABSTRACT

A sound producing cell includes a membrane and an actuating layer. The membrane includes a first membrane subpart and a second membrane subpart, wherein the first membrane subpart and the second membrane subpart are opposite to each other. The actuating layer is disposed on the first membrane subpart and the second membrane subpart. The first membrane subpart includes a first anchored edge which is fully or partially anchored, and edges of the first membrane subpart other than the first anchored edge are non-anchored. The second membrane subpart includes a second anchored edge which is fully or partially anchored, and edges of the second membrane subpart other than the second anchored edge are non-anchored.

4 Claims, 20 Drawing Sheets

FIG. 16

SOUND PRODUCING CELL AND MANUFACTURING METHOD THEREOF

CROSS REFERENCE TO RELATED APPLICATIONS

This application is a division of U.S. application Ser. No. 17/720,333, filed on Apr. 14, 2022, which claims the benefit of U.S. Provisional Application No. 63/187,357, filed on May 11, 2021. The contents of these applications are incorporated herein by reference.

BACKGROUND OF THE INVENTION

1. Field of the Invention

The present application relates to a sound producing cell and a manufacturing method thereof, and more particularly, to a sound producing cell having a high yield rate and/or a high performance and to a manufacturing method of a sound producing cell.

2. Description of the Prior Art

Since micro sound producing devices, such as MEMS (Micro Electro Mechanical System) microspeakers, can be used in various electronic devices due to their small size, the micro sound producing devices are developed rapidly in recent years. For example, a MEMS microspeaker may use a thin film piezoelectric material as actuator and a silicon-containing layer as membrane which are formed by at least one semiconductor process. In order to make the microspeaker more widely used, industry is committed to designing the microspeaker with the high yield rate and the high performance.

SUMMARY OF THE INVENTION

It is therefore a primary objective of the present invention to provide a sound producing cell having a specific slit design and/or a specific recess design to enhance the yield rate and the performance, and to provide a manufacturing method of a sound producing cell.

An embodiment of the present invention provides a sound producing cell including a membrane and an actuating layer. The membrane includes a first membrane subpart and a second membrane subpart, wherein the first membrane subpart and the second membrane subpart are opposite to each other. The actuating layer is disposed on the first membrane subpart and the second membrane subpart. The first membrane subpart includes a first anchored edge which is fully or partially anchored, and edges of the first membrane subpart other than the first anchored edge are non-anchored. The second membrane subpart includes a second anchored edge which is fully or partially anchored, and edges of the second membrane subpart other than the second anchored edge are non-anchored.

Another embodiment of the present invention provides a manufacturing method of a sound producing cell. The manufacturing method includes: providing a wafer including a first layer and a second layer; patterning the first layer of the wafer, so as to form at least one trench line; disposing a wafer on a substrate; wherein the first layer includes a membrane, and at least one slit is formed within and penetrates through the membrane because of the at least one trench line; wherein the membrane includes a first membrane subpart and a second membrane subpart, wherein the first membrane subpart and the second membrane subpart are opposite to each other; wherein the first membrane subpart includes a first anchored edge which is fully or partially anchored, and edges of the first membrane subpart other than the first anchored edge are non-anchored; wherein the second membrane subpart includes a second anchored edge which is fully or partially anchored, and edges of the second membrane subpart other than the second anchored edge are non-anchored.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 16 is a schematic diagram of a top view illustrating a sound producing cell according to a seventh embodiment of the present invention.

DETAILED DESCRIPTION

Figure 1:
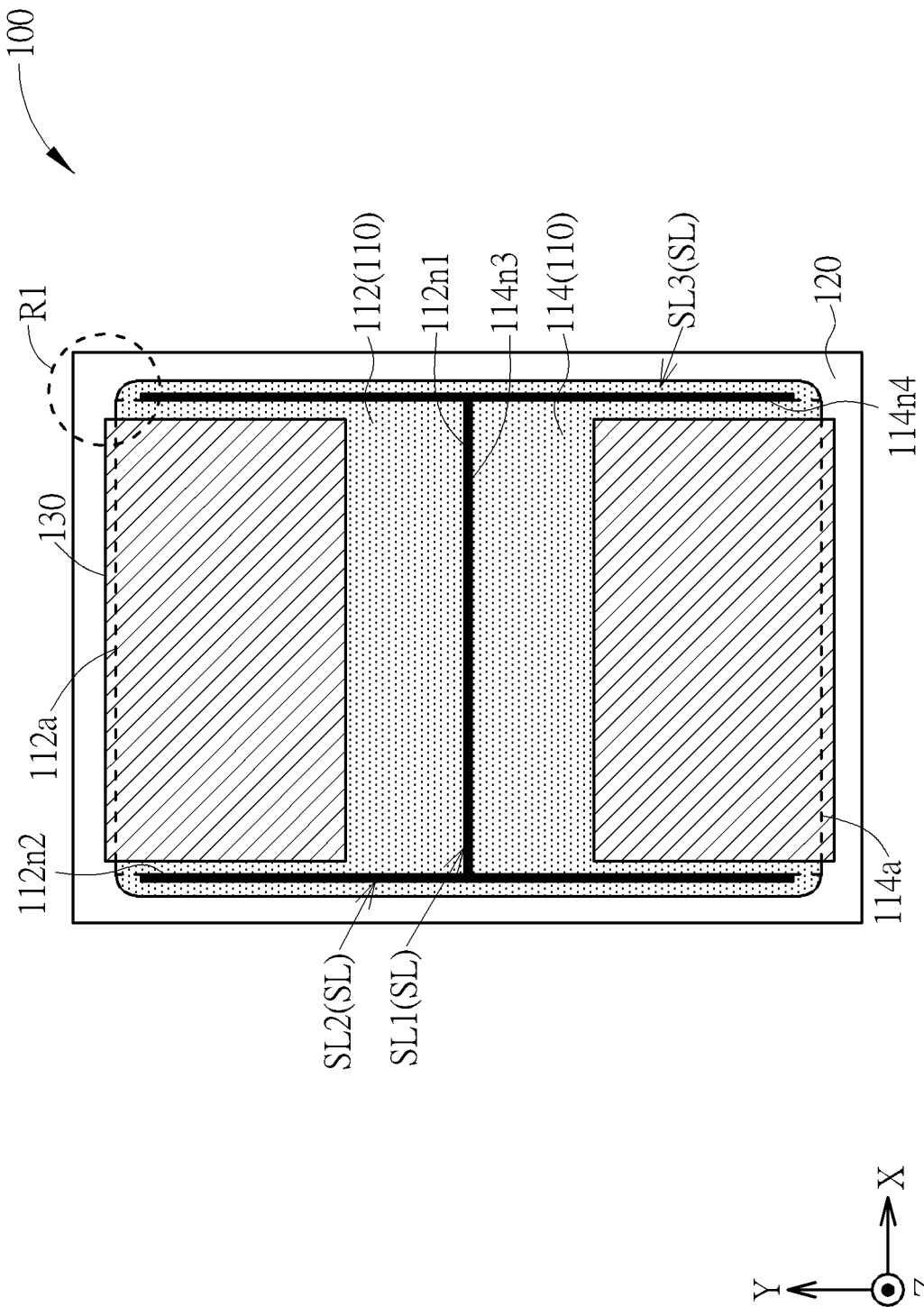
FIG. 1 is a schematic diagram of a top view illustrating a sound producing cell according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when "a B1 component is formed by/of C1", C1 exist in the formation of B1 component or C1 is used in the formation of B1 component, and the existence and use of one or a plurality of other features, areas, steps, operations and/or components are not excluded in the formation of B1 component.

In the following, the term "horizontal direction" generally means a direction parallel to a horizontal surface, the term "horizontal surface" generally means a surface parallel to a direction X and direction Y in the drawings, and the term "vertical direction" generally means a direction parallel to a direction Z in the drawings, wherein the directions X, Y and Z are perpendicular to each other. In the following, the term "top view" generally means a viewing result along the vertical direction, and the term "side view" generally means a viewing result along the horizontal direction.

In the following description and in the claims, the term "substantially" generally means a small deviation may exist or not exist. For instance, the terms "substantially parallel" and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 μm or 1 μm. For instance, the term "substantially the same" means that a deviation is within, e.g., 10% of a given value or range, or mean within 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

In the present invention, the sound producing cell may perform an acoustic transformation converting signals (e.g. electric signals or signals with other suitable type) into an acoustic wave. In some embodiments, the sound producing cell may be a component in a sound producing device, a speaker, a microspeaker or other suitable device, so as to convert the electric signals into the acoustic wave, but not limited thereto. Note that an operation of the sound producing cell means that the acoustic transformation is performed by the sound producing cell (e.g., the acoustic wave is produced by actuating the sound producing cell with electrical driving signal).

In the use of the sound producing cell, the sound producing cell may be disposed on a base. The base may be hard or flexible, wherein the base may include silicon, germanium, glass, plastic, quartz, sapphire, metal, polymer (e.g., polyimide (PI), polyethylene terephthalate (PET)), any other suitable material or a combination thereof. As an example, the base may be a circuit board including a laminate (e.g. copper clad laminate, CCL), a land grid array (LGA) board or any other suitable board containing conductive material, but not limited thereto. Note that a normal direction of the base may be parallel to the direction Z in the drawings.

Figure 2:
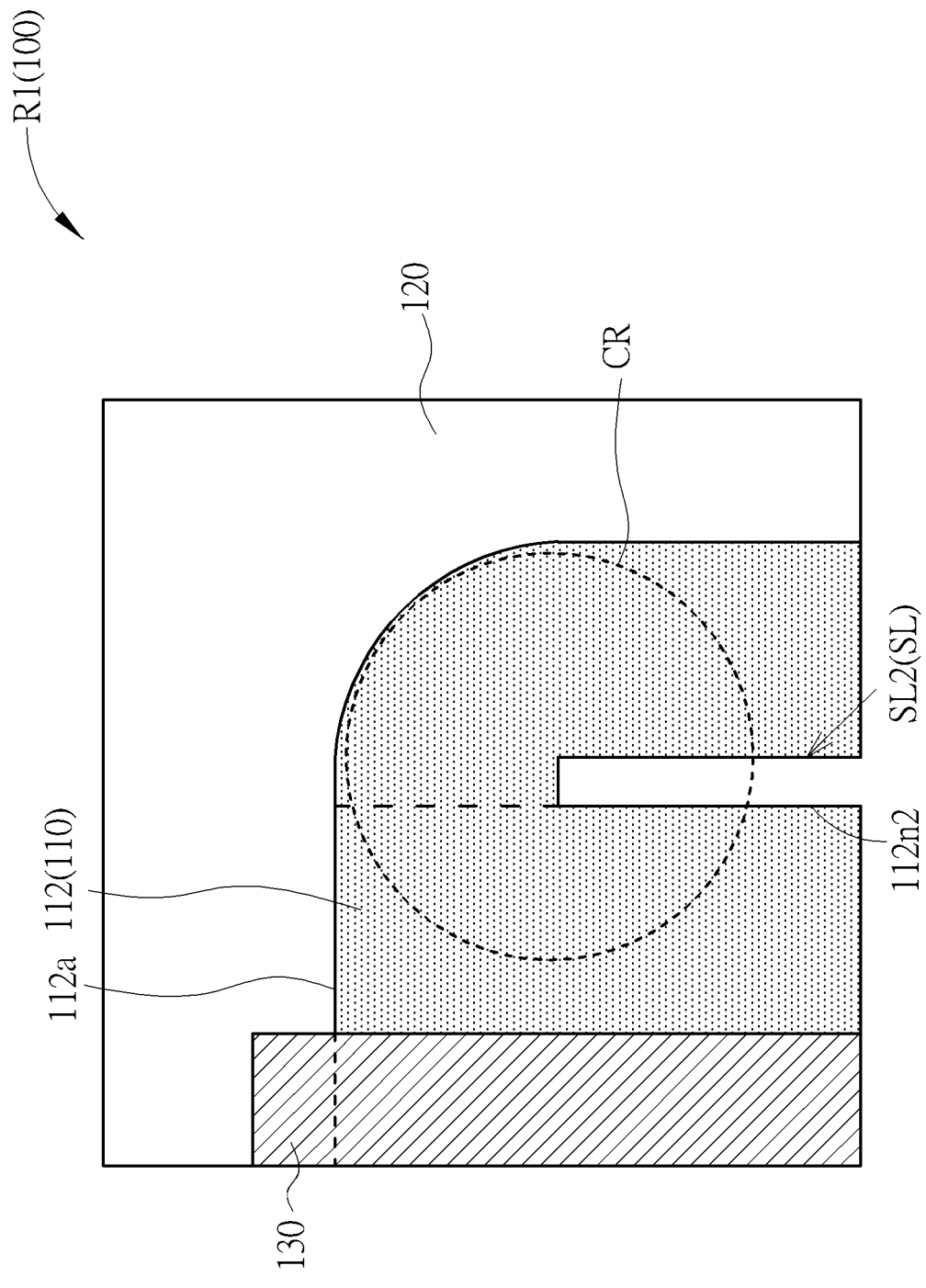
FIG. 2 is an enlarging schematic diagram showing a structure in a region R1 in FIG. 1.

Referring to FIG. 1 and FIG. 2, FIG. 1 is a schematic diagram of a top view illustrating a sound producing cell according to a first embodiment of the present invention, and FIG. 2 is an enlarging schematic diagram showing a structure in a region R1 in FIG. 1. As shown in FIG. 1, the sound producing cell 100 includes a membrane 110 and at least one anchor structure 120 outside the membrane 110, wherein the membrane 110 is connected to the anchor structure 120, so as to be anchored by the anchor structure 120. For example, the membrane 110 may be surrounded by the anchor structure 120, but not limited thereto.

In the operation of the sound producing cell 100, the membrane 110 can be actuated to have a movement. In this embodiment, the membrane 110 may be actuated to move upwardly and downwardly, but not limited thereto. Note that, in the present invention, the terms "move upwardly" and "move downwardly" represent that the membrane 110 moves substantially along the direction Z. During the operation of the sound producing cell 100, the anchor structure 120 may be immobilized. Namely, the anchor structure 120 may be a fixed end (or fixed edge) respecting the membrane 110 during the operation of the sound producing cell 100.

A shape of the membrane 110 may be designed based on requirement(s). In some embodiments, the shape of the membrane 110 may be a polygon (i.e., a rectangle or a rectangle with chamfers), a shape having a curved edge or other suitable shapes, but not limited thereto. For example, the shape of the membrane 110 shown in FIG. 1 may be a rectangle with chamfers, but not limited thereto.

The membrane 110 and the anchor structure 120 may include any suitable material(s). In some embodiments, the membrane 110 and the anchor structure 120 may individually include silicon (e.g., single crystalline silicon or polycrystalline silicon), silicon compound (e.g., silicon carbide, silicon oxide), germanium, germanium compound (e.g., gallium nitride or gallium arsenide), gallium, gallium compound or a combination thereof, but not limited thereto. The membrane 110 and the anchor structure 120 may have the same material or different materials.

In the present invention, the membrane 110 may include a plurality of subparts. As shown in FIG. 1, the membrane 110 includes a first membrane subpart 112 and a second membrane subpart 114, wherein the first membrane subpart 112 and the second membrane subpart 114 are opposite to each other in the top view, only one edge of the first membrane subpart 112 is anchored by being connected to the anchor structure 120, only one edge of the second membrane subpart 114 is anchored by being connected to the anchor structure 120, and other edges of the first membrane subpart 112 and other edges of the second membrane subpart 114 are non-anchored and not connected to the anchor structure 120 (these edges are referred as "non-anchored edges" in the following). Namely, in FIG. 1, a first anchored edge 112a of the first membrane subpart 112 is an only one edge of the first membrane subpart 112 which is anchored, and a second anchored edge 114a of the second membrane subpart 114 is an only one edge of the second membrane subpart 114 which is anchored, wherein the first membrane subpart 112 is directly connected to the anchor structure 120 through the first anchored edge 112a only, and the second membrane subpart 114 is directly connected to the anchor structure 120 through the second anchored edge 114a only. In the present invention, the first anchored edge 112a and the second anchored edge 114a may be fully or partially anchored. For example, in the embodiment shown in FIG. 1, the first anchored edge 112a and the second anchored edge 114a are fully anchored.

As shown in FIG. 1, the membrane 110 has a plurality of slits SL, wherein the membrane 110 may be divided into the subparts by the slit(s) SL. In the present invention, the slit SL may have at least one straight pattern, at least one curved pattern or a combination thereof, and a width of the slit SL should be sufficiently small. For example, the width of the slit SL may range from 1 μm to 5 μm, but not limited thereto.

In FIG. 1 and FIG. 2, the membrane 110 may have a first slit SL1, at least one second slit SL2 and at least one third slit SL3, wherein the first slit SL1 may be formed between the first membrane subpart 112 and the second membrane subpart 114, the second slit SL2 may be formed between the first membrane subpart 112 and the anchor structure 120, the third slit SL3 may be formed between the second membrane subpart 114 and the anchor structure 120, an end of the second slit SL2 may be situated in a corner region CR (shown in FIG. 2) of the membrane 110, and an end of the third slit SL3 may be situated in another corner region CR of the membrane 110. For example, in FIG. 1, the membrane 110 may have one first slit SL1, two second slits SL2 and two third slits SL3 which are straight, the first membrane subpart 112 may be between two second slits SL2 in the top view, and the second membrane subpart 114 may be between two third slits SL3 in the top view, but not limited thereto.

In FIG. 1, the non-anchored edges of each subpart may be accomplished by the slits SL. Regarding the first membrane subpart 112, a first non-anchored edge 112n1 opposite to the first anchored edge 112a in the top view may be defined by the first slit SL1, and a second non-anchored edge 112n2 adjacent to the first anchored edge 112a is defined by the second slit SL2. Regarding the second membrane subpart 114, a third non-anchored edge 114n3 opposite to the second anchored edge 114a in the top view may be defined by the first slit SL1, and a fourth non-anchored edge 114n4 adjacent to the second anchored edge 114a is defined by the third slit SL3.

In the present invention, shapes of the subparts of the membrane 110 may be designed based on requirement(s), wherein the shape of the subpart of the membrane 110 of may be a polygon (i.e., a rectangle), a shape having a curved edge or other suitable shapes. For instance, in FIG. 1, the shape of the first membrane subpart 112 and the shape of the second membrane subpart 114 may substantially be rectangles, and the first membrane subpart 112 and the second membrane subpart 114 may be substantially congruent, but not limited thereto. Thus, in FIG. 1, the second non-anchored edge 112n2 may be adjacent to and between the first non-anchored edge 112n1 and the first anchored edge 112a, and the fourth non-anchored edge 114n4 may be adjacent to and between the third non-anchored edge 114n3 and the second anchored edge 114a, but not limited thereto. In FIG. 1, the second slit SL2 and the third slit SL3 are connected to the first slit SL1. For example, the first slit SL1 may be connected between two second slits SL2 and connected between two third slits SL3, but not limited thereto.

Since the shape of the first membrane subpart 112 and the shape of the second membrane subpart 114 may substantially be rectangles, the first anchored edge 112a, the first non-anchored edge 112n1, the second anchored edge 114a and the third non-anchored edge 114n3 are substantially parallel to each other and have substantially the same length, and the second non-anchored edges 112n2 and the fourth non-anchored edges 114n4 are substantially parallel to each other (i.e., parallel to the direction X) and have substantially the same length. That is to say, the first slit SL1 defining the first non-anchored edge 112n1 and the third non-anchored edge 114n3 is parallel to the first anchored edge 112a and the second anchored edge 114a.

In some embodiments, in FIG. 1, the second slit SL2 and the third slit SL3 may be connected, such that the second slit SL2 and the third slit SL3 may be combined to form a long straight slit, but not limited thereto.

As shown in FIG. 1, the first anchored edge 112a of the first membrane subpart 112 is one of the edges of the membrane 110, and the second anchored edge 114a of the second membrane subpart 114 is another one of the edges of the membrane 110. The second non-anchored edge 112n2 of the first membrane subpart 112 may be or may not be one of the edges of the membrane 110, and the fourth non-anchored edge 114n4 of the second membrane subpart 114 may be or may not be one of the edges of the membrane 110. For example, in FIG. 1, the second non-anchored edge 112n2 of the first membrane subpart 112 may not be the edge of the membrane 110, and the fourth non-anchored edge 114n4 of the second membrane subpart 114 may not be the edge of the membrane 110, such that the second slit SL2 may be between the first membrane subpart 112 and one of the edges of the membrane 110 in the top view, and the third slit SL3 may be between the second membrane subpart 114 and one of the edges of the membrane 110 in the top view, but not limited thereto.

Note that the slit SL may release the residual stress of the membrane 110, wherein the residual stress is generated during the manufacturing process of the membrane 110 or originally exist in the membrane 110.

The sound producing cell 100 may include an actuating layer 130 disposed on the membrane 110 and configured to actuate the membrane 110. In some embodiments, as shown in FIG. 1, the actuating layer 130 may not totally overlap the membrane 110 in the top view. For example, in FIG. 1, the actuating layer 130 may be disposed on the first membrane subpart 112 and the second membrane subpart 114, and the actuating layer 130 may overlap a portion of the first membrane subpart 112 and a portion of the second membrane subpart 114 in the top view. Optionally, in FIG. 1, the actuating layer 130 may be disposed on and overlap the anchor structure 120, and the actuating layer 130 may overlap the anchored edge of the subpart of the membrane 110, but not limited thereto.

As shown in FIG. 1, in the top view, a distance may exist between the actuating layer 130 and the slit SL, so as to enhance the reliability of the slit SL and the actuating layer 130, but not limited thereto.

The actuating layer 130 may include an actuator having a monotonic electromechanical converting function with respect to the movement of membrane 110 along the direction Z. In some embodiments, the actuating layer 130 may include a piezoelectric actuator, an electrostatic actuator, a nanoscopic-electrostatic-drive (NED) actuator, an electromagnetic actuator or any other suitable actuator, but not limited thereto. For example, in an embodiment, the actuating layer 130 may include a piezoelectric actuator, the piezoelectric actuator may contain such as two electrodes and a piezoelectric material layer (e.g., lead zirconate titanate, PZT) disposed between the electrodes, wherein the piezoelectric material layer may actuate the membrane 110 based on driving signals (e.g., driving voltages) received by the electrodes, but not limited thereto. For example, in another embodiment, the actuating layer 130 may include an electromagnetic actuator (such as a planar coil), wherein the electromagnetic actuator may actuate the membrane 110 based on a received driving signals (e.g., driving current) and a magnetic field (i.e. the membrane 110 may be actuated by the electromagnetic force), but not limited thereto. For example, in still another embodiment, the actuating layer 130 may include an electrostatic actuator (such as conducting plate) or a NED actuator, wherein the electrostatic actuator or the NED actuator may actuate the membrane 110 based on a received driving signals (e.g., driving voltage) and an electrostatic field (i.e. the membrane 110 may be actuated by the electrostatic force), but not limited thereto.

The membrane 110 is actuated by the actuating layer 130, so as to move along the direction Z, thereby performing the acoustic transformation. Namely, the subpart of the membrane 110 may be actuated to perform an up-and-down movement, such that the acoustic transformation is performed. Note that, the acoustic wave is produced due to the movement of the membrane 110 actuated by the actuating layer 130, and the movement of the membrane 110 is related to a sound pressure level (SPL) of the acoustic wave.

When the subpart performs the up-and-down movement, openings in the direction Z may be formed and adjacent to its all non-anchored edges. For example, in the operation of the sound producing cell 100, a central opening may be formed between the first non-anchored edge 112$n$1 of the first membrane subpart 112 and the third non-anchored edge 114$n$3 of the second membrane subpart 114, and side openings may be respectively formed between the second non-anchored edge 112$n$2 of the first membrane subpart 112 and the anchor structure 120 and between the fourth non-anchored edge 114$n$4 of the second membrane subpart 114 and the anchor structure 120.

The subparts of the membrane 110 move along the same direction or opposite directions based on requirement(s). In some embodiments, the first membrane subpart 112 and the second membrane subpart 114 may move up and down in the direction Z synchronously (i.e., the first membrane subpart 112 and the second membrane subpart 114 may be actuated to move toward the same direction) to avoid big central opening between the first membrane subpart 112 and the second membrane subpart 114 from being formed, but not limited thereto.

The actuating layer 130 may actuate the membrane 110 to produce the acoustic wave based on received driving signal(s). The acoustic wave is corresponding to an input audio signal, and the driving signal applied on the actuating layer 130 is corresponding to (related to) the input audio signal.

Note that, the short side of the sound producing cell 100 (or membrane 110) may be beneficial for obtaining higher resonant frequency, and the long side of the sound producing cell 100 (or membrane 110) may be beneficial for enlarging SPL. In other words, the sound producing cell 100 (or membrane 110) with large aspect ratio, a ratio of a length of the long side thereof with respect to a length of the short side, may achieve both higher resonant frequency and the larger SPL, compared to a cell with less aspect ratio. The aspect ratio for the sound producing cell 100 (or membrane 110) may depend on practical requirement. For example, the aspect ratio of the sound producing cell 100 (or membrane 110) may be larger than 2, so as to enhance the performance of the sound producing cell 100, but not limited thereto.

In the following, the details of a method of manufacturing a sound producing cell 100 will be further exemplarily explained. Note that in the following manufacturing method, the actuating layer 130 in the sound producing cell 100 may include a piezoelectric actuator for example, but not limited thereto. Any suitable type actuator can be included in the actuating layer 130 of the sound producing cell 100.

In the following manufacturing method, the forming process may include atomic layer deposition (ALD), a chemical vapor deposition (CVD) and other suitable process(es) or a combination thereof. The patterning process may include such as a photolithography, an etching process, any other suitable process(es) or a combination thereof.

Figure 3:
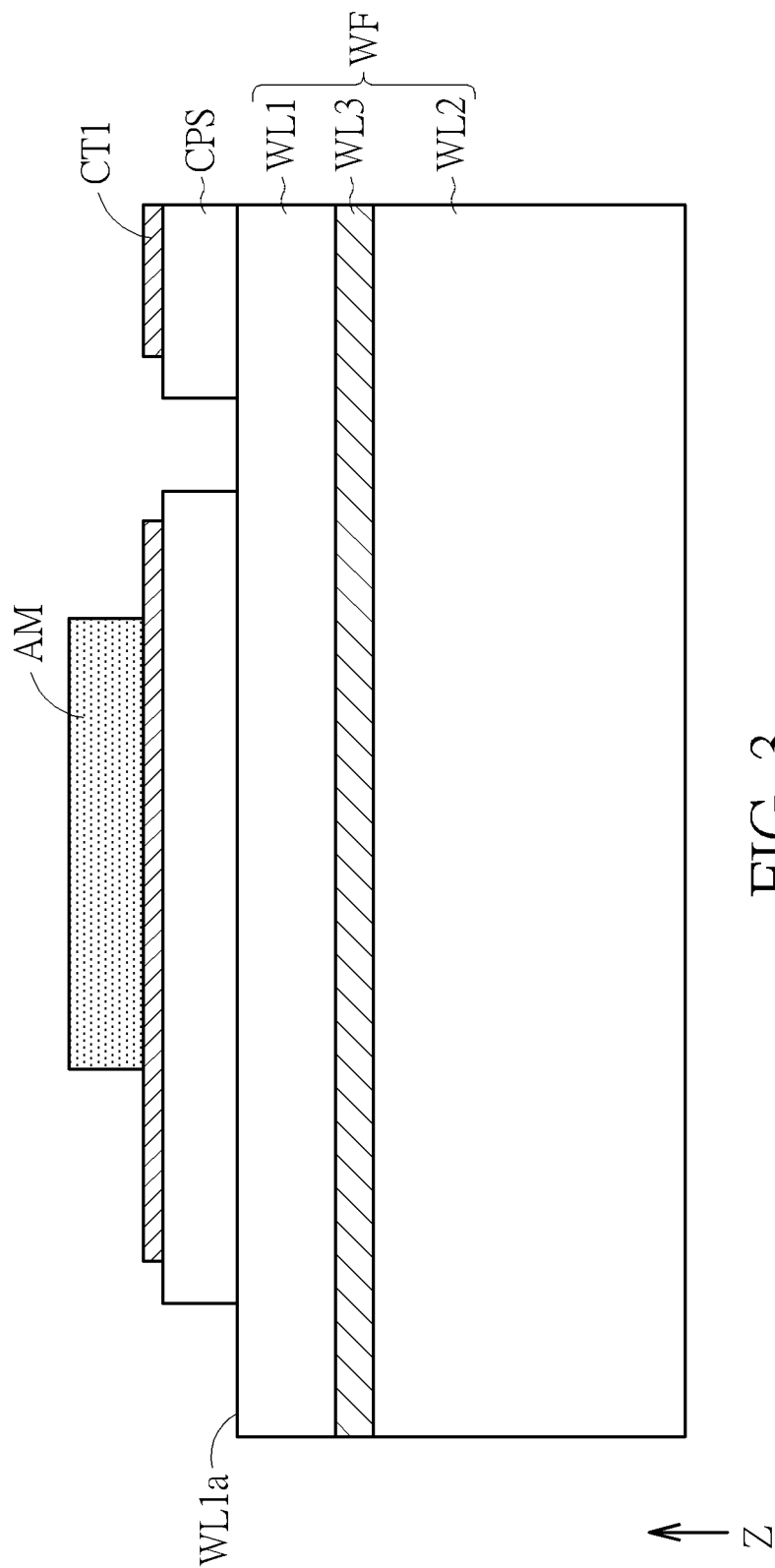
FIG. 3 to FIG. 8 are schematic diagrams illustrating structures at different stages of a manufacturing method of a sound producing cell according to an embodiment of the present invention.

Referring to FIG. 3 to FIG. 8, FIG. 3 to FIG. 8 are schematic diagrams illustrating structures at different stages of a manufacturing method of a sound producing cell according to an embodiment of the present invention. In this embodiment, the sound producing cell 100 may be manufactured by at least one semiconductor process to be a MEMS chip, but not limited thereto. As shown in FIG. 3, a wafer WF is provided, wherein the wafer WF may include a first layer WL1 and a second layer WL2, and may optionally include an insulating layer WL3 between the first layer WL1 and the second layer WL2.

The first layer WL1, the insulating layer WL3 and the second layer WL2 may individually include any suitable material, such that the wafer WF may be any suitable type. For instance, the first layer WL1 and the second layer WL2 may individually include silicon (e.g., single crystalline silicon or poly-crystalline silicon), silicon carbide, germanium, gallium nitride, gallium arsenide, other suitable material or a combination thereof. In some embodiments, the first layer WL1 may include single crystalline silicon, such that the wafer WF may be a silicon on insulator (SOI) wafer, but not limited thereto. For instance, the insulating layer WL3 may include oxide, such as silicon oxide (e.g., silicon dioxide), but not limited thereto. The thicknesses of the first layer WL1, the insulating layer WL3 and the second layer WL2 may be individually adjusted based on requirement(s).

In FIG. 3, a compensation oxide layer CPS may be optionally formed on an upper side of the wafer WF, wherein the upper side is upper than a top surface WL1$a$ of the first layer WL1 opposite to the second layer WL2, such that the first layer WL1 is between the compensation oxide layer CPS and the second layer WL2. The material of oxide contained in the compensation oxide layer CPS and the thickness of the compensation oxide layer CPS may be designed based on requirement(s).

In FIG. 3, a first conductive layer CT1 and an actuating material AM may be formed on the upper side of the wafer WF (on the first layer WL1) in sequence, such that the first conductive layer CT1 may be between the actuating material AM and the first layer WL1. In some embodiments, the first conductive layer CT1 may be in contact with the actuating material AM.

The first conductive layer CT1 may include any suitable conductive material, and the actuating material AM may include any suitable material. In some embodiments, the first conductive layer CT1 may include metal (such as platinum), and the actuating material AM may include a piezoelectric material, but not limited thereto. For example, the piezoelectric material may include such as a lead-zirconate-titanate (PZT) material, but not limited thereto. Moreover, the thicknesses of the first conductive layer CT1 and the actuating material AM may be individually adjusted based on requirement(s).

Then, in FIG. 3, the actuating material AM, the first conductive layer CT1 and the compensation oxide layer CPS may be patterned in sequence.

Figure 4:
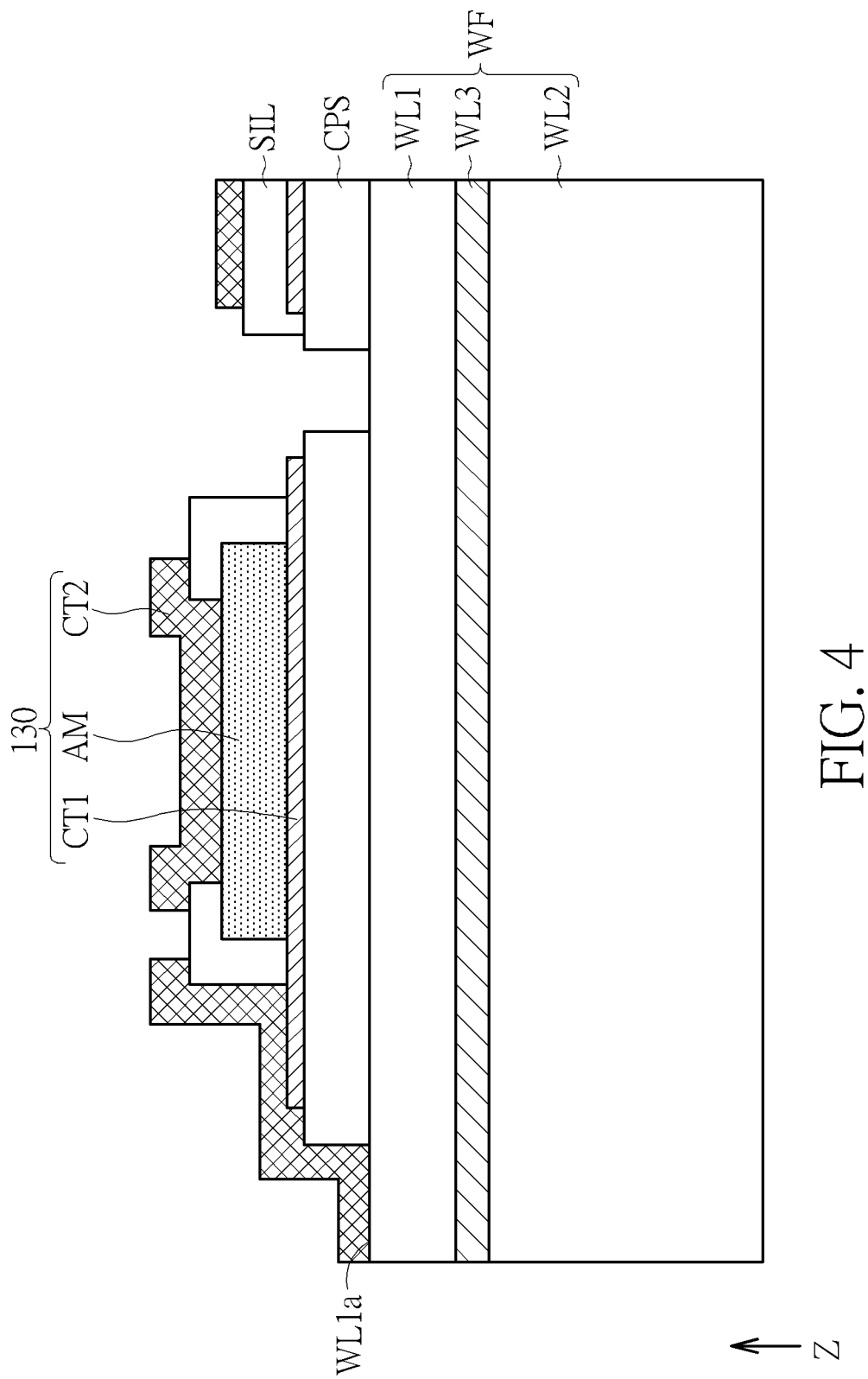

As shown in FIG. 4, a separating insulating layer SIL may be formed on the actuating material AM and be patterned. The thickness of the separating insulating layer SIL and the material of the separating insulating layer SIL may be designed based on requirement(s). For instance, the material of the separating insulating layer SIL may be oxide, but not limited thereto.

As shown in FIG. 4, a second conductive layer CT2 may be formed on the actuating material AM and the separating insulating layer SIL, and then, the second conductive layer CT2 may be patterned. The thickness of the second conductive layer CT2 and the material of the second conductive layer CT2 may be designed based on requirement(s). For instance, the second conductive layer CT2 may include metal (such as platinum), but not limited thereto. For instance, the second conductive layer CT2 may be in contact with the actuating material AM.

The actuating material AM, the first conductive layer CT1 and the second conductive layer CT2 may be sub-layers in the actuating layer 130 of the sound producing cell 100, so as to make the actuating layer 130 have a piezoelectric actuator including two electrodes and the actuating material AM between two electrodes.

In FIG. 4, the separating insulating layer SIL may be configured to separate at least a portion of the first conductive layer CT1 from at least a portion of the second conductive layer CT2.

Figure 5:
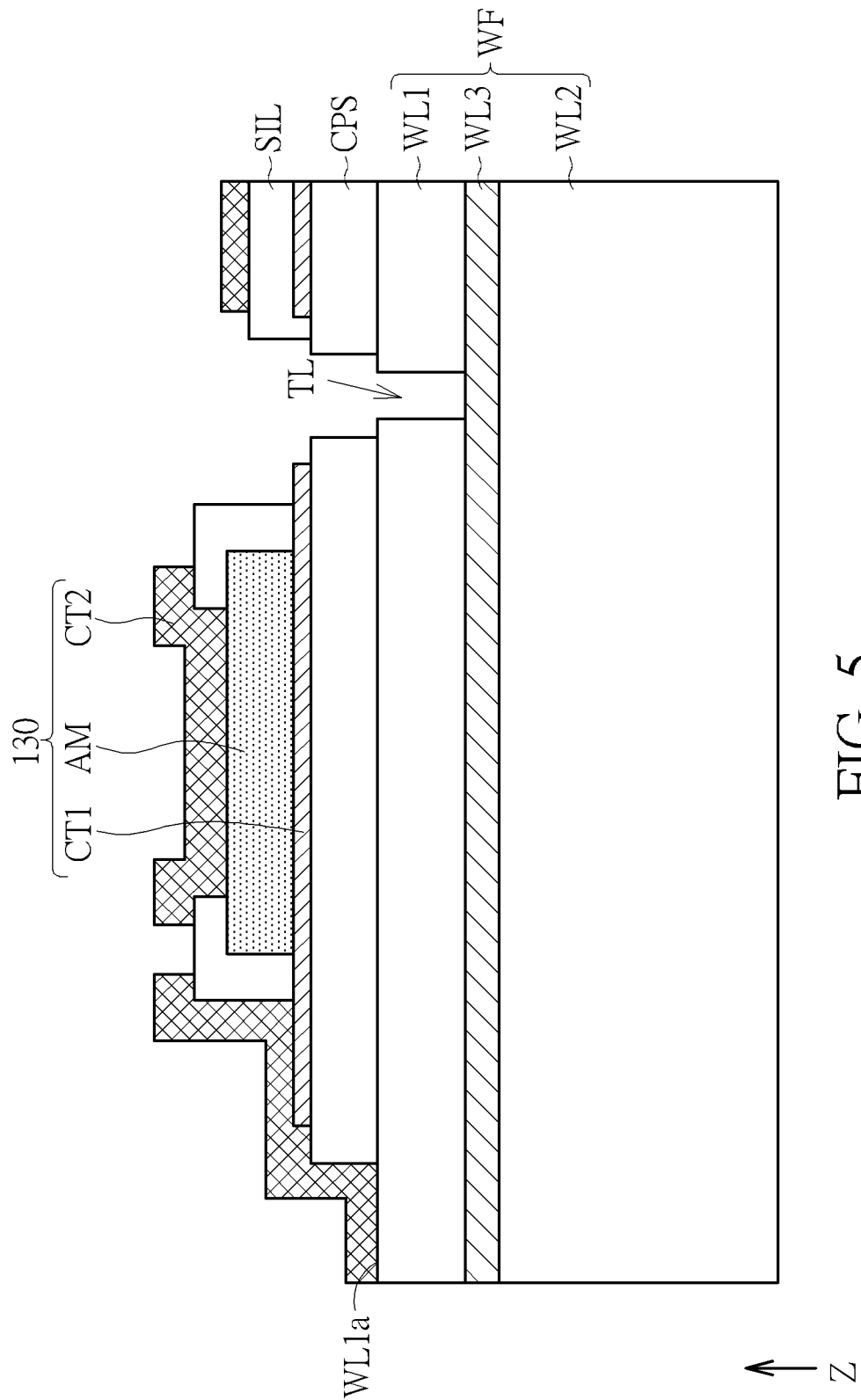

As shown in FIG. 5, the first layer WL1 of the wafer WF may be patterned, so as to form a trench line TL. In FIG. 5, the trench line TL is a portion where the first layer WL1 is removed. That is to say, the trench line TL is between two parts of the first layer WL1.

Figure 6:
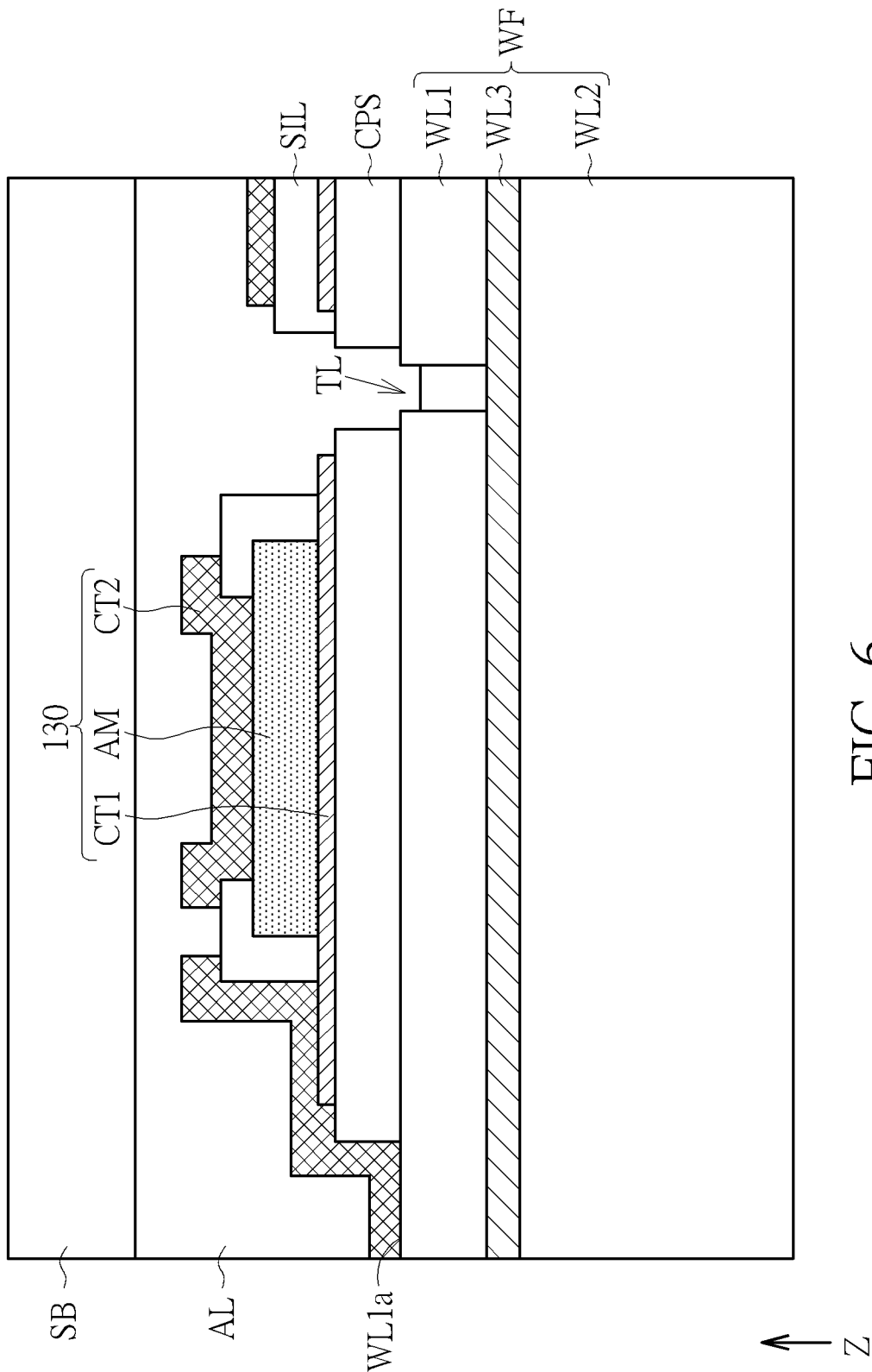

As shown in FIG. 6, the wafer WF is disposed on a substrate SB and an adhering layer AL, wherein the adhering layer AL is adhered between the substrate SB and the first layer WL1 of the wafer WF. In FIG. 6, the actuating layer 130 is between the wafer WF and the substrate SB. Due to this step, the first layer WL1 of the wafer WF and the structures on the upper side of the wafer WF (i.e., the structures upper than the top surface WL1a of the wafer WF) may be protected in subsequent steps.

Figure 7:
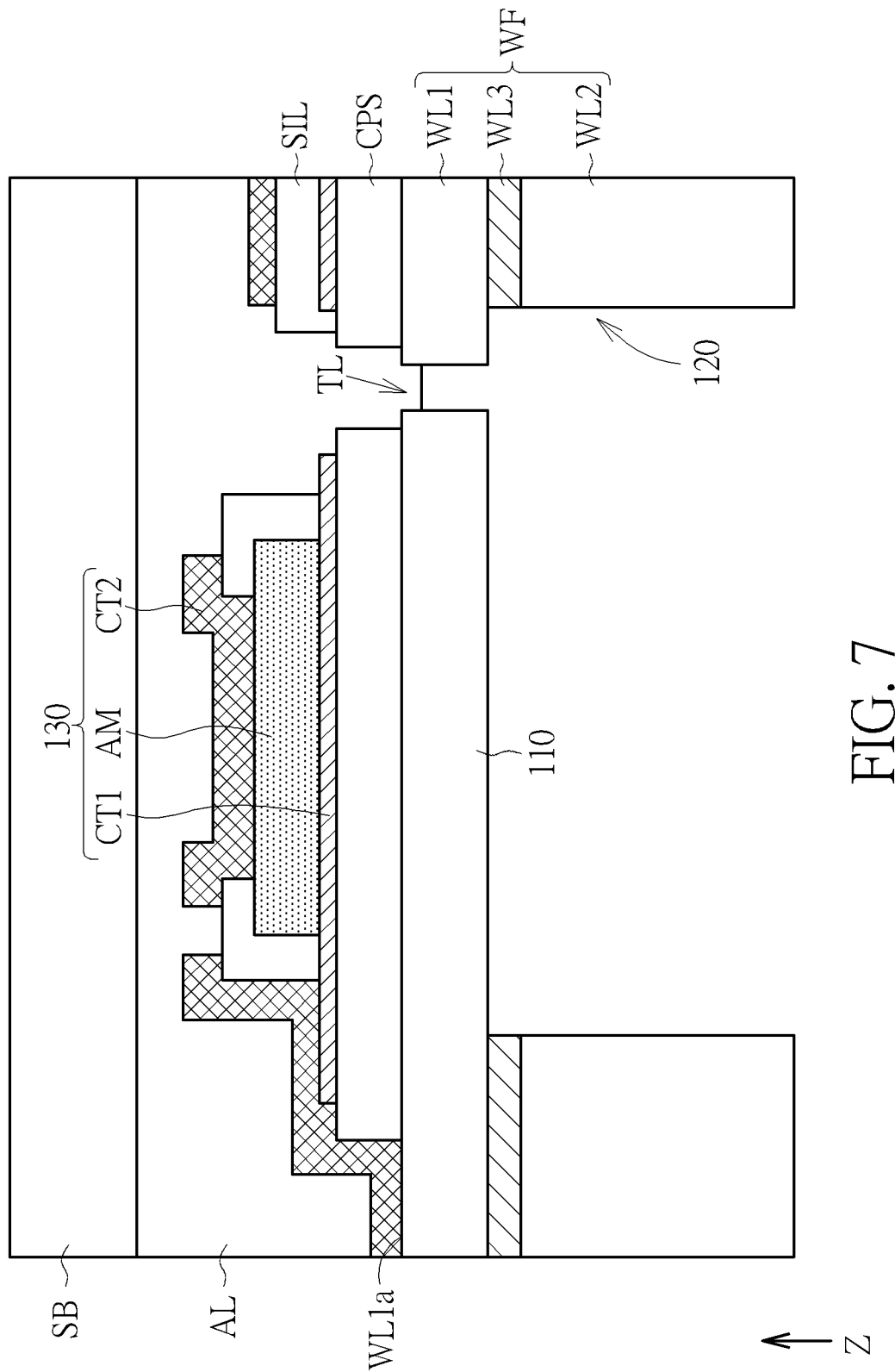

As shown in FIG. 7, the second layer WL2 of the wafer WF may be patterned, so as to make the second layer WL2 form the anchor structure 120 and to make the first layer WL1 form the membrane 110 anchored by the anchor structure 120. In detail, the second layer WL2 of the wafer WF may have a first part and a second part, the first part of the second layer WL2 may be removed, and the second part of the second layer WL2 may form the anchor structure 120. Since the first part of the second layer WL2 is removed, the first layer WL1 forms the membrane 110, wherein the membrane 110 is corresponding to the removing first part of the second layer WL2 in the top view. For example, the first part of the second layer WL2 may be removed by a deep reactive ion etching (DRIE) process, but not limited thereto. Note that the subparts (e.g., the first membrane subpart 112 and the second membrane subpart 114) of the membrane 110 are determined when patterning the first layer WL1 of the wafer WF to form the trench line(s) TL.

Optionally, in FIG. 7, since the insulating layer WL3 of the wafer WF exists, after the second layer WL2 of the wafer WF is patterned, a part of the insulating layer WL3 corresponding to the first part of the second layer WL2 may be removed also, so as to make the first layer WL1 form the membrane 110, but not limited thereto.

Furthermore, in FIG. 7, the second part of the second layer WL2, a portion of the insulating layer WL3 overlapping the second part of the second layer WL2 and a portion of the first layer WL1 overlapping the second part of the second layer WL2 may be combined to serve as the anchor structure 120.

Figure 8:
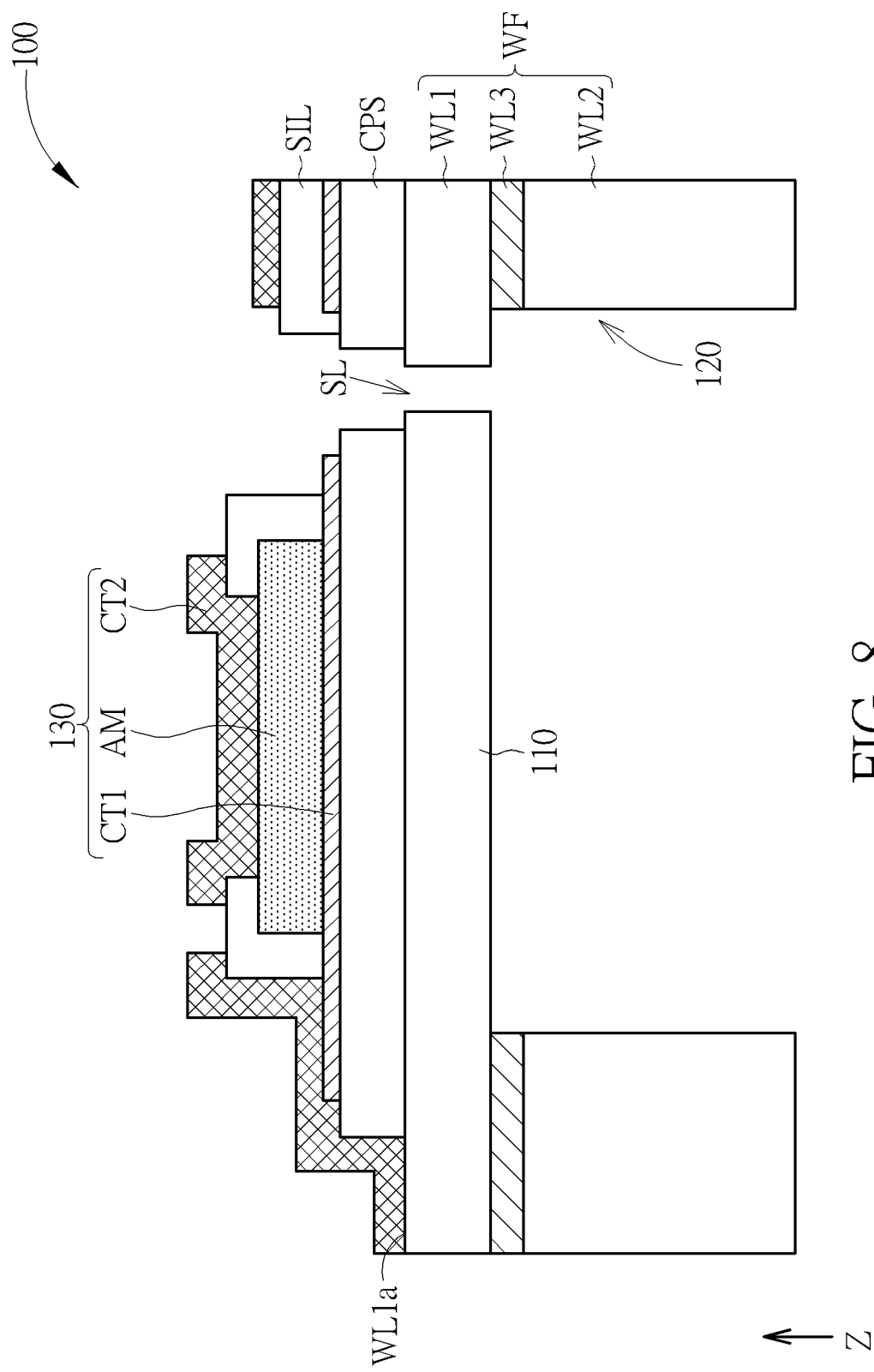

As shown in FIG. 8, the substrate SB and the adhering layer AL are removed by a suitable process, so as to complete the manufacture of the sound producing cell 100. For example, the substrate SB and the adhering layer AL may be removed by a peel-off process, but not limited thereto.

In FIG. 8, since the first part of the second layer WL2 is removed to make the membrane 110 included in the first layer WL1 be formed, the slit SL is formed within and penetrates through the membrane 110 because of the trench line TL. Since the slit SL is formed because of the trench line TL, the width of the trench line TL may be designed based on the requirement of the slit SL. For example, the width of the trench line TL may be less than or equal to 5 µm, less than or equal to 3 µm, or less than or equal to 2 µm, so as to make the slit SL have desire width, but not limited thereto.

The sound producing cell and its manufacturing method of the present invention are not limited by the above embodiments. Other embodiments of the present invention are described below. For ease of comparison, same components will be labeled with the same symbol in the following. The following descriptions relate the differences between each of the embodiments, and repeated parts will not be redundantly described.

Figure 9:
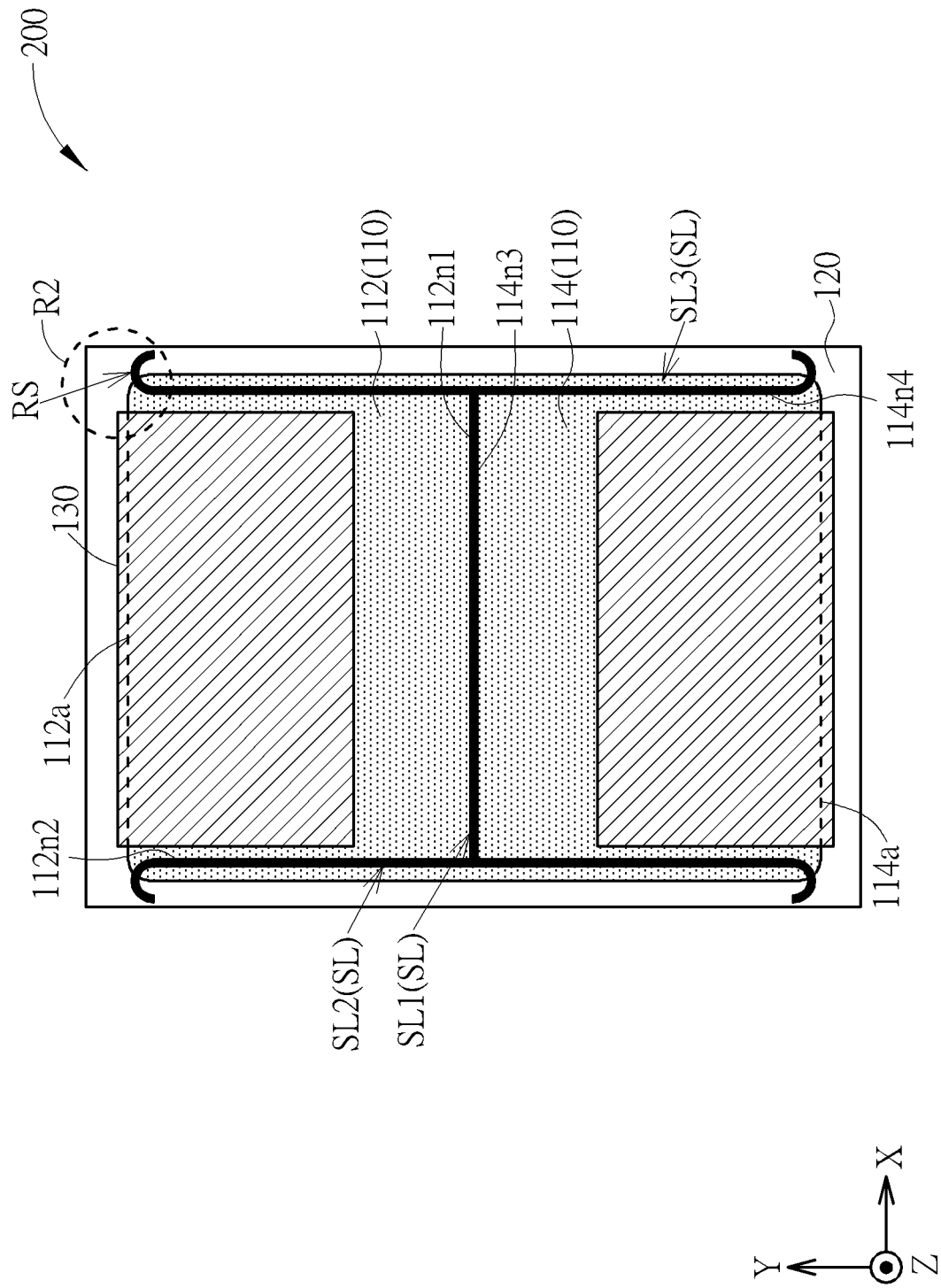
FIG. 9 is a schematic diagram of a top view illustrating a sound producing cell according to a second embodiment of the present invention.
Figure 10:
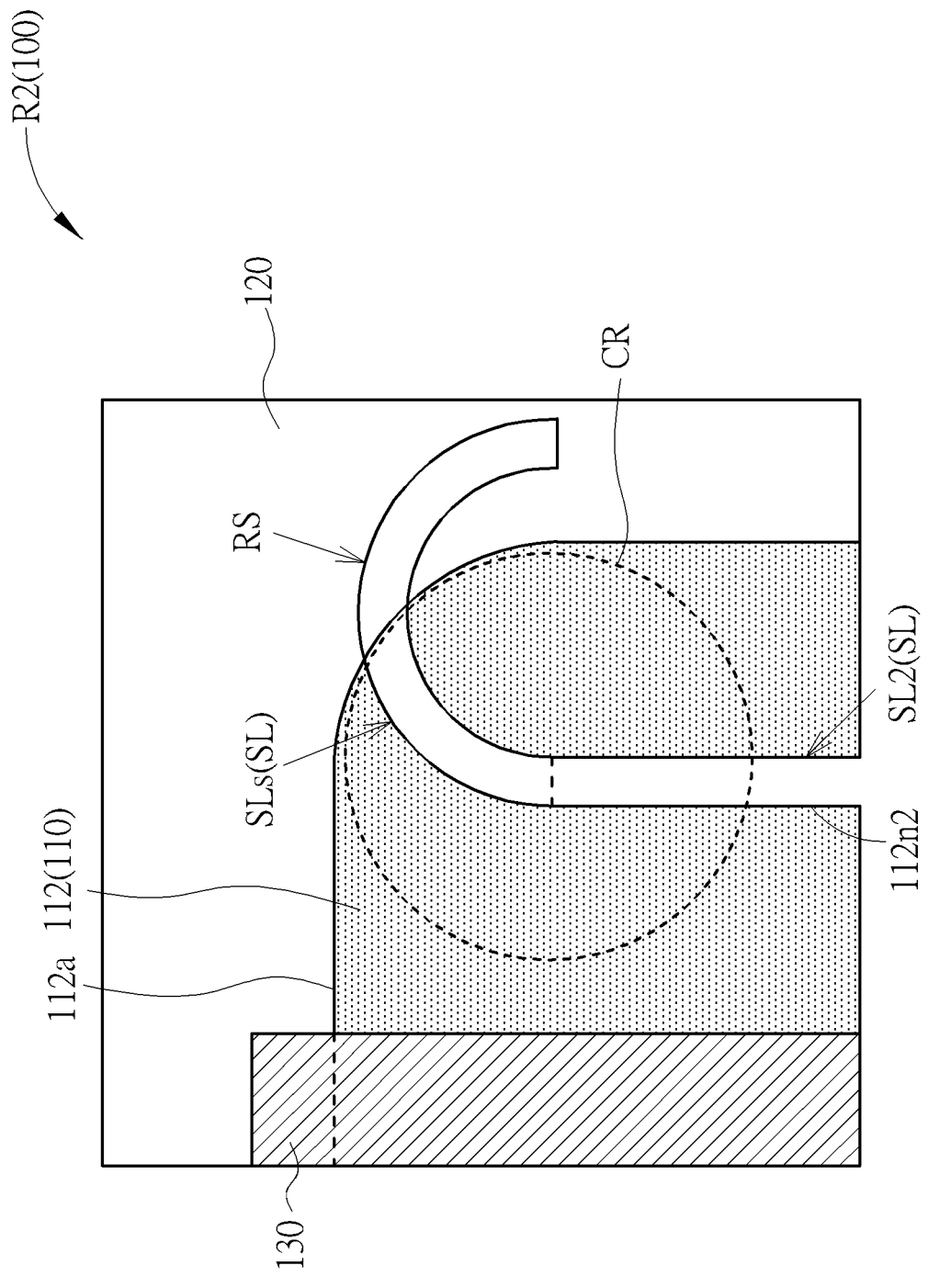
FIG. 10 is an enlarging schematic diagram showing a structure in a region R2 in FIG. 9.

Referring to FIG. 9 and FIG. 10, FIG. 9 is a schematic diagram of a top view illustrating a sound producing cell according to a second embodiment of the present invention, and FIG. 10 is an enlarging schematic diagram showing a structure in a region R2 in FIG. 9. As shown in FIG. 9 and FIG. 10, a difference between this embodiment and the first embodiment is that the sound producing cell 200 of this embodiment includes a recess structure RS disposed at a corner of the sound producing cell 200 and outside the membrane 110, wherein the recess structure RS is directly connected to a slit segment SLs in the corner region CR of the membrane 110. In the embodiment shown in FIG. 9, the sound producing cell 200 may include four recess structures RS disposed at four corners of the sound producing cell 200 and outside the membrane 110, but not limited thereto.

The slit segment SLs in the corner region CR may be a slit SL connected to the second slit SL2 or the third slit SL3, or the slit segment SLs in the corner region CR may be a portion of the second slit SL2 or a portion of the third slit SL3. The slit segment SLs may have a curved pattern, a straight pattern or a combination thereof. For example, in FIG. 10, the slit segment SLs may be connected between the end of the second slit SL2 situated in the corner region CR and the recess structure RS, and the slit segment SLs may have a curved pattern, but not limited thereto.

As shown in FIG. 9 and FIG. 10, the recess structure RS may be formed on the anchor structure 120 and at a corner of the sound producing cell 200. For example, the sound producing cell 200 may have a first layer WL1 and a second layer WL2 disposed under the first layer WL1 (e.g., FIG. 8), wherein a portion of the first layer WL1 may be configured to serve as the membrane 110 (i.e., the first layer WL1 may include the membrane 110), another portion of the first layer WL1 may surround the membrane 110 and combine with the second layer WL2 to be the anchor structure 120, the slit segment SLs in the corner region CR of the membrane 110 may pass through the first layer WL1, and the recess structure RS may pass through the first layer WL1 and have a bottom belonging to the anchor structure 120 (e.g., the second layer WL2), but not limited thereto. In this case, regarding the manufacturing method of the sound producing cell 200, the slits SL of the membrane 110 and the recess structure RS may be patterned (etched) in the same process (the same etching process).

As shown in FIG. 9 and FIG. 10, the recess structure RS may have a curved pattern, and the curved pattern of the recess structure RS may be designed based on requirement(s). For instance, in FIG. 10, the slit segment SLs in the corner region CR and the recess structure RS may be combined to form a pattern with a half circular arc, but not limited thereto.

The existence of the curved recess structure RS connected to the slit segment SLs situating in the corner region CR may enhance the success rate of the manufacturing process of the sound producing cell 200, thereby increasing the yield rate of the sound producing cell 200. In detail, in the step of removing the substrate SB and the adhering layer AL (e.g., the peel-off process), due to the existence of the curved recess structure RS connected to the slit segment SLs situating in the corner region CR, the stress concentration position may be changed from the corner region CR of the membrane 110 (e.g., the end of the slit SL) to the recess structure RS, and the stress applied on the recess structure RS may be dispersed, so as to reduce the damage on the membrane 110 during this process. Moreover, since the recess structure RS has the curved pattern, the stress applied on the recess structure RS in this process may be dispersed effectively, so as to decrease the damage on the recess structure RS, thereby enhancing the success rate of the manufacturing process of the sound producing cell 200.

Figure 11:
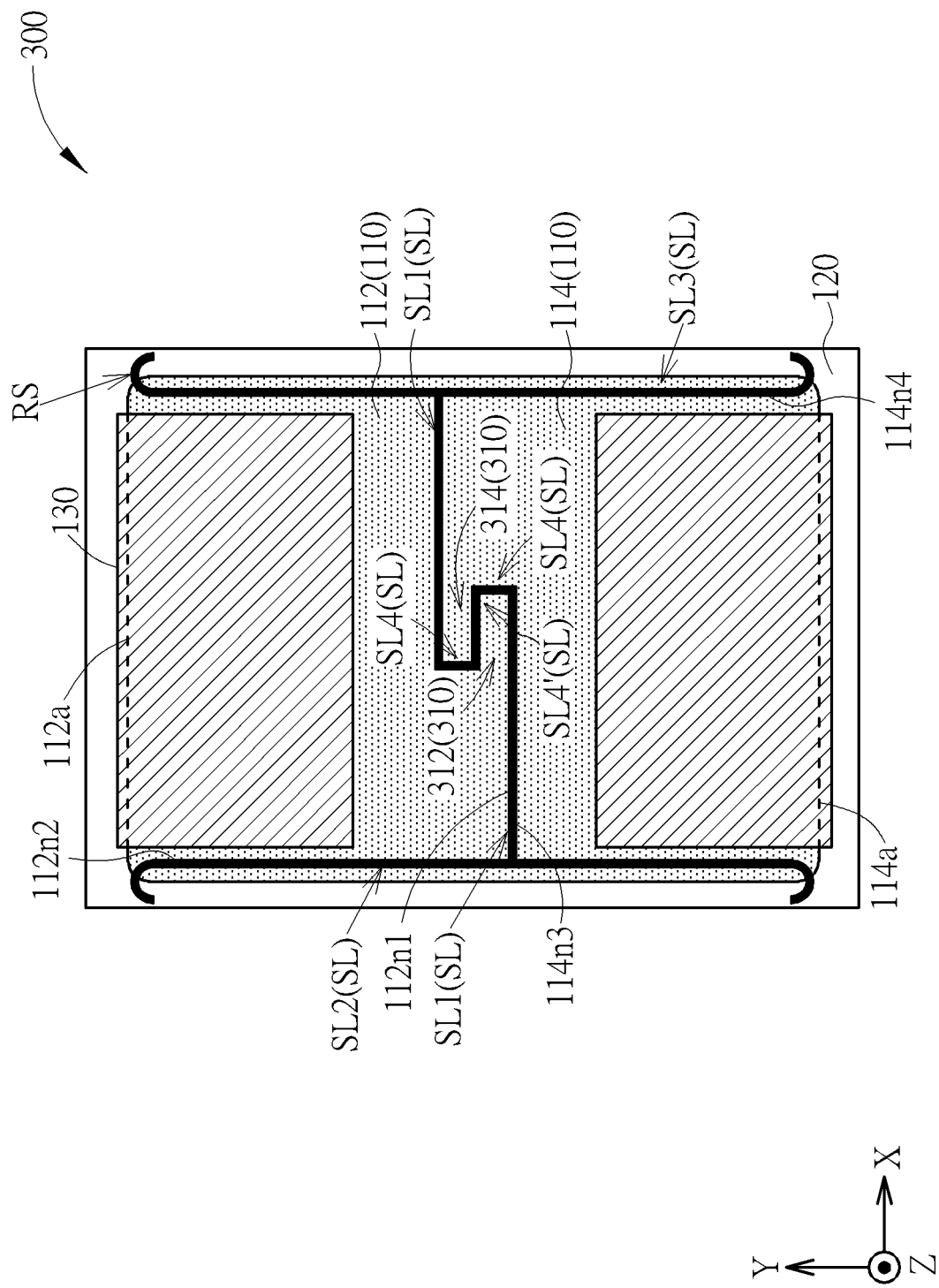
FIG. 11 is a schematic diagram of a top view illustrating a sound producing cell according to a third embodiment of the present invention.

Referring to FIG. 11, FIG. 11 is a schematic diagram of a top view illustrating a sound producing cell according to a third embodiment of the present invention. As shown in FIG. 11, a difference between this embodiment and the first embodiment is that the membrane 110 of the sound producing cell 300 of this embodiment includes a latch structure 310. Under the condition that the first membrane subpart 112 and the second membrane subpart 114 moves along the direction Z (i.e., the normal direction of the base where the membrane 110 is disposed), the latch structure 310 may lock the first membrane subpart 112 and the second membrane subpart 114 when a moving distance of the first membrane subpart 112 along the direction Z and a moving distance of the second membrane subpart 114 along the direction Z are greater than a threshold value. Namely, the latch structure 310 is configured to limit moving distances of the first membrane subpart 112 and the second membrane subpart 114.

Because the subpart of the membrane 110 only has one anchored edge, the subpart of the membrane 110 may be fragile and may be damaged in the manufacturing process. In this embodiment, the existence of the latch structure 310 may enhance the success rate of manufacturing the membrane 110, thereby increasing the yield rate of the sound producing cell 300. In detail, in the step of removing the substrate SB and the adhering layer AL (e.g., the peel-off process), the displacement of the first membrane subpart 112 and the displacement of the second membrane subpart 114 along the direction Z are caused by the adhering force of the adhering layer AL. In this case, the latch structure 310 may lock the first membrane subpart 112 and the second membrane subpart 114 when the first membrane subpart 112 and the second membrane subpart 114 move along the direction Z with a displacement greater than the threshold value, so as to limit the movement of the first membrane subpart 112 and the second membrane subpart 114 and provide a restoring force for the first membrane subpart 112 and the second membrane subpart 114, thereby reducing the damage on the membrane 110.

The latch structure 310 may have any suitable design based on requirement(s). In this embodiment, the latch structure 310 shown in FIG. 11 may be formed because of the slit(s) SL. For example, in FIG. 11, the latch structure 310 may be formed because of two first slits SL1 and three fourth slits SL4 and SL4', wherein the first slits SL1 and the fourth slits SL4 and SL4' may be between the first membrane subpart 112 and the second membrane subpart 114, and three fourth slits SL4 and SL4' may be connected between two first slits SL1. In FIG. 11, the first slits SL1 may be parallel to each other, but not limited thereto. In FIG. 11, the fourth slit SL4' extending along the direction X may be connected between two fourth slits SL4 extending along the direction Y, and the fourth slit SL4 extending along the direction Y may be connected between the fourth slits SL4' extending along the direction X and the first slit SL1 extending along the direction X, but not limited thereto.

As shown in FIG. 11, the latch structure 310 may include a first latch component 312 and a second latch component 314, the first latch component 312 may be a portion of the first membrane subpart 112 (equivalently, the first latch component 312 may belong to the first membrane subpart 112), and the second latch component 314 may be a portion of the second membrane subpart 114 (equivalently, the second latch component 314 may belong to the second membrane subpart 114). In FIG. 11, the first latch component 312 may be disposed between the second latch component 314 of the second membrane subpart 114 and another portion of the second membrane subpart 114, and the second latch component 314 may be disposed between the first latch component 312 of the first membrane subpart 112 and another portion of the first membrane subpart 112. For example, in FIG. 11, a length direction of the first latch component 312 and a length direction of the second latch component 314 may be substantially parallel to the direction X, but not limited thereto.

When the first membrane subpart 112 and the second membrane subpart 114 move along the direction Z with a displacement greater than the threshold value, the first latch component 312 is buckled to the second latch component 314, so as to lock the first membrane subpart 112 and the second membrane subpart 114. Note that the width of the slit SL and the size of the latch component are related to the buckled effect of the latch structure 310.

Figure 12:
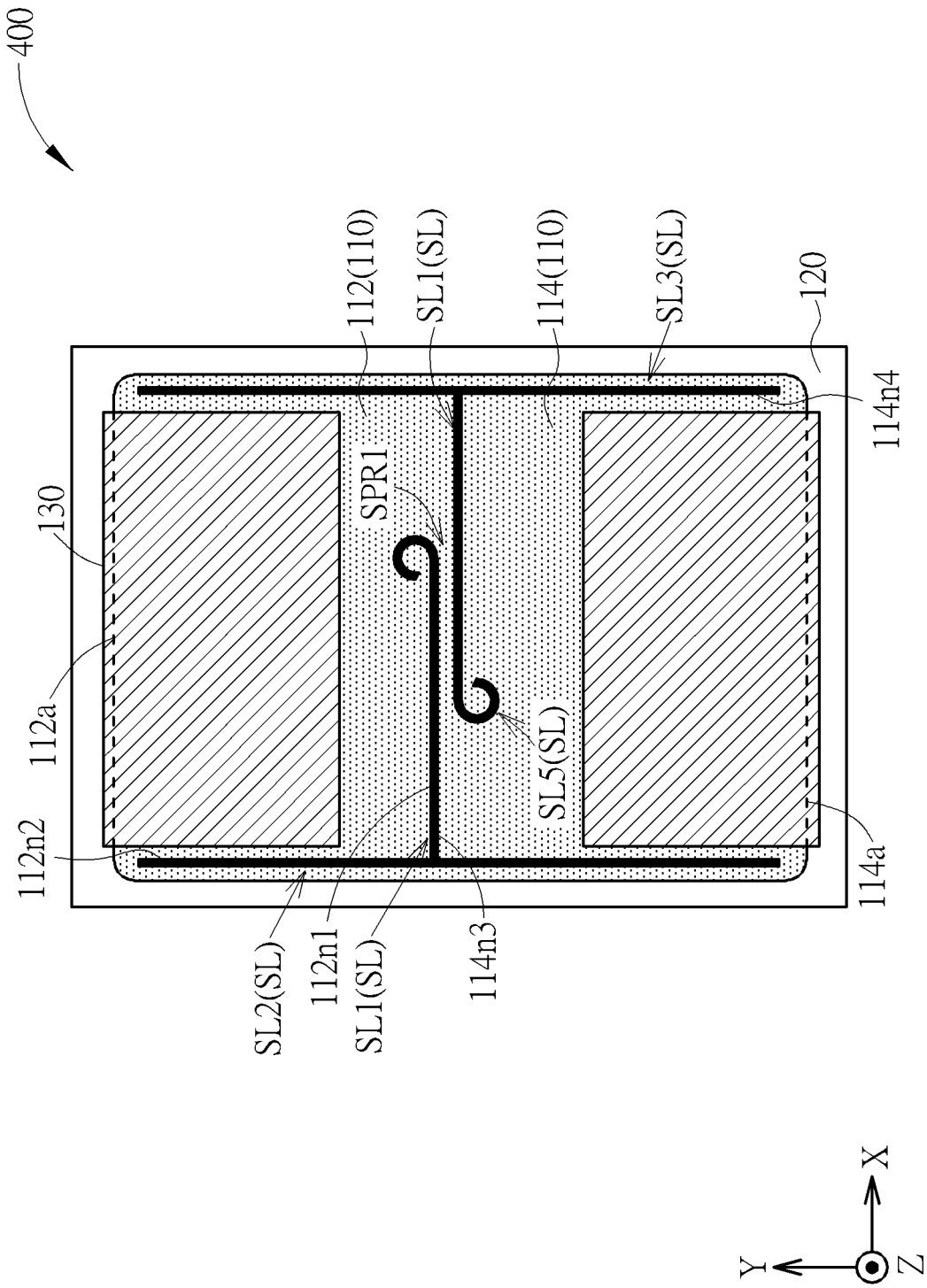
FIG. 12 is a schematic diagram of a top view illustrating a sound producing cell according to a fourth embodiment of the present invention.

Referring to FIG. 12, FIG. 12 is a schematic diagram of a top view illustrating a sound producing cell according to a fourth embodiment of the present invention. As shown in FIG. 12, a difference between this embodiment and the first embodiment is that the membrane 110 of the sound producing cell 400 of this embodiment includes at least one spring connected between the subparts of membrane 110, wherein the number of the spring(s) may be designed based on requirement(s). In FIG. 12, the membrane 110 may include a first spring SPR1 directly connected between the first membrane subpart 112 and the second membrane subpart 114.

Because of the existence of the first spring SPR1, the success rate of manufacturing the membrane 110 may be enhanced, thereby increasing the yield rate of the sound producing cell 400. In detail, in the step of removing the substrate SB and the adhering layer AL, the displacement of the first membrane subpart 112 and the displacement of the second membrane subpart 114 along the direction Z are caused by the adhering force of the adhering layer AL. When the first membrane subpart 112 and the second membrane subpart 114 move along the direction Z with a large displacement, the first spring SPR1 may limit the movement of the first membrane subpart 112 and the second membrane subpart 114 and provide a restoring force for the first membrane subpart 112 and the second membrane subpart 114, thereby reducing the damage on the membrane 110.

The spring may have any suitable design based on requirement(s). As shown in FIG. 12, the first spring SPR1 may be formed because of the slit(s) SL. In this embodiment, the first spring SPR1 shown in FIG. 12 may be formed because of two first slits SL1 and two fifth slits SL5, wherein the fifth slit SL5 may be connected to the first slit SL1, and the fifth slit SL5 may have a curved pattern. For instance, the fifth slit SL5 may include a hook-shaped curved pattern, and one end of the fifth slit SL5 is not connected to another slit SL, but not limited thereto. For instance, the first slits SL1 may be parallel to each other, but not limited thereto.

When the membrane 110 moves, the stress caused by the deformation of the membrane 110 may applied on the spring. In FIG. 12, because the fifth slit SL5 includes the curved pattern (i.e., the hook-shaped curved pattern), the effect of the stress concentration may be reduced, such that the damage on the membrane 110 and the first spring SPR1 may be reduced, thereby increasing the yield rate of the sound producing cell 400.

In addition, as shown in FIG. 12, a connecting direction from the first spring SPR1 to the first membrane subpart 112 may be different from a connecting direction from the first spring SPR1 to the second membrane subpart 114. For example, in FIG. 12, the connecting direction from the first spring SPR1 to the first membrane subpart 112 may be opposite to the connecting direction from the first spring SPR1 to the second membrane subpart 114, but not limited thereto. For example, in FIG. 12, the first spring SPR1 may substantially be a 1-shape, but not limited thereto.

Figure 13:
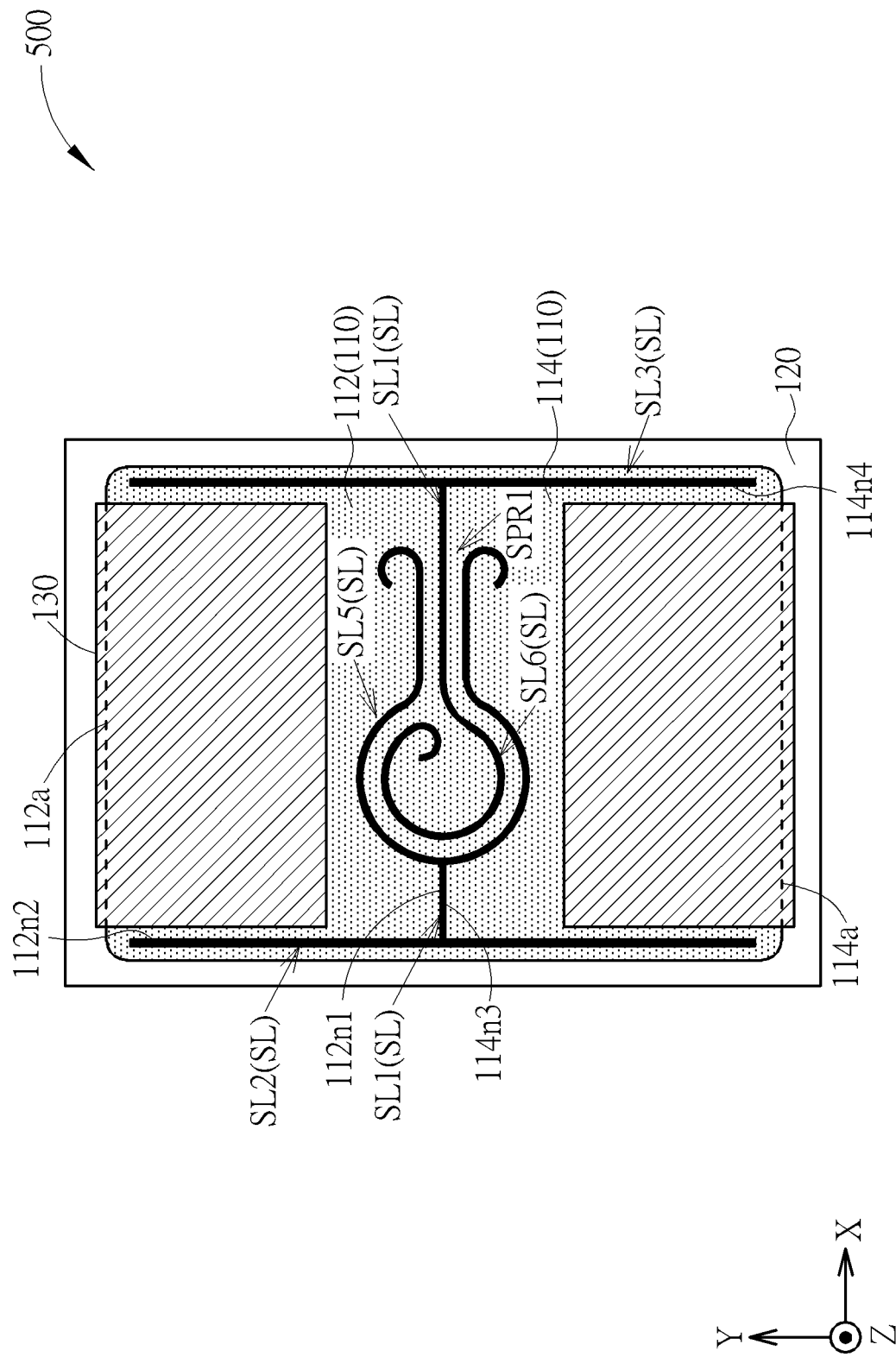
FIG. 13 is a schematic diagram of a top view illustrating a sound producing cell according to a fifth embodiment of the present invention.

Referring to FIG. 13, FIG. 13 is a schematic diagram of a top view illustrating a sound producing cell according to a fifth embodiment of the present invention. As shown in FIG. 13, a difference between this embodiment and the fourth embodiment is the design of the first spring SPR1. In FIG. 13, the first spring SPR1 of the membrane 110 of the sound producing cell 500 may be formed because of the two first slits SL1, two fifth slits SL5 and a sixth slit SL6, wherein two fifth slits SL5 may be connected to the same first slit SL1, the sixth slit SL6 may be connected to another first slit SL1, the fifth slit SL5 may have two curved pattern and one straight pattern, and the sixth slit SL6 may be between two fifth slits SL5 and have a curved pattern. For instance, the fifth slit SL5 may include a hook-shaped curved pattern, and one end of the fifth slit SL5 is not connected to another slit SL, but not limited thereto.

In addition, in the first spring SPR1 shown in FIG. 13, the connecting direction from the first spring SPR1 to the first membrane subpart 112 may be the same as the connecting direction from the first spring SPR1 to the second membrane subpart 114, but not limited thereto. For example, in FIG. 13, the first spring SPR1 may substantially be a U-shape, but not limited thereto. Due to this design, the size of the central opening between the first membrane subpart 112 and the second membrane subpart 114 may be decreased, so as to reduce the leakage of the air in the operation of the sound producing cell 500.

When the membrane 110 moves, the stress caused by the deformation of the membrane 110 may applied on the spring. In FIG. 13, because of the design of the U-shape first spring SPR1 having curved slits SL, the effect of the stress concentration may be reduced, such that the damage on the membrane 110 and the first spring SPR1 may be reduced, thereby increasing the yield rate of the sound producing cell 500.

Figure 14:
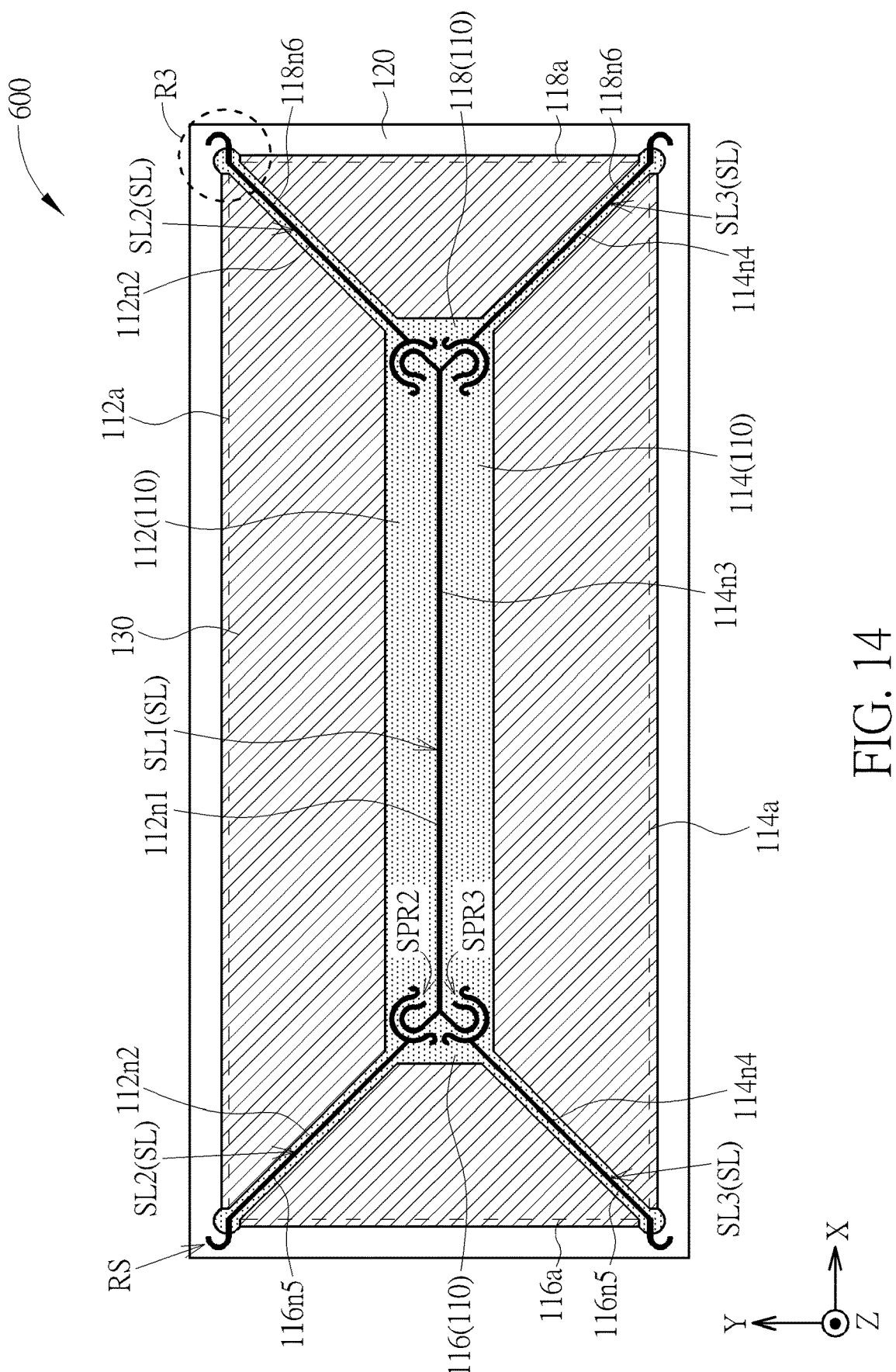
FIG. 14 is a schematic diagram of a top view illustrating a sound producing cell according to a sixth embodiment of the present invention.
Figure 15:
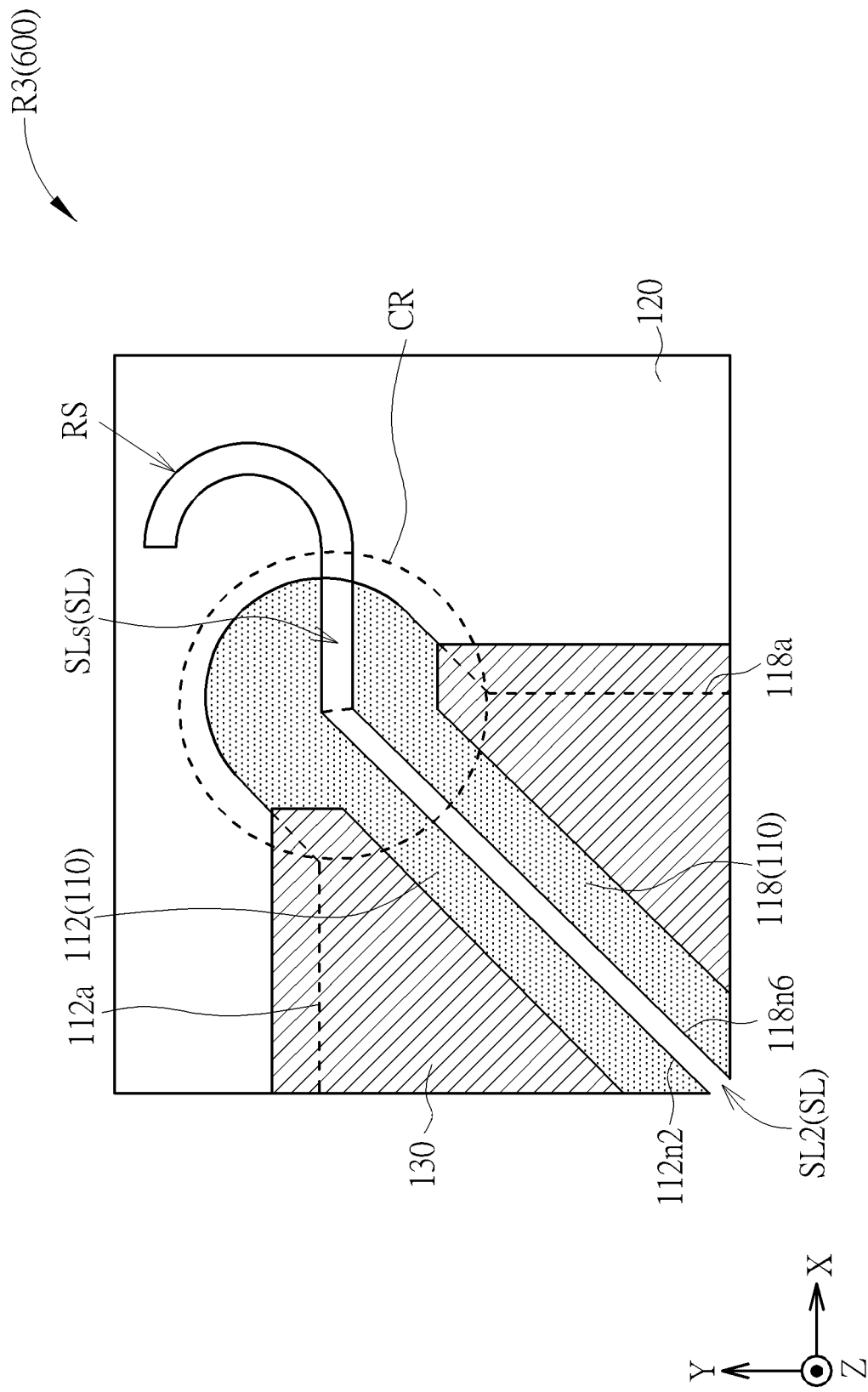
FIG. 15 is an enlarging schematic diagram showing a structure in a region R3 in FIG. 14.

Referring to FIG. 14 and FIG. 15, FIG. 14 is a schematic diagram of a top view illustrating a sound producing cell according to a sixth embodiment of the present invention, and FIG. 15 is an enlarging schematic diagram showing a structure in a region R3 in FIG. 14. As shown in FIG. 14 and FIG. 15, a difference between this embodiment and the first embodiment is that the membrane 110 of the sound producing cell 600 of this embodiment further includes a third membrane subpart 116 and a fourth membrane subpart 118. The third membrane subpart 116 and the fourth membrane subpart 118 may be disposed between the first membrane subpart 112 and the second membrane subpart 114 in the top view, and the third membrane subpart 116 and the fourth membrane subpart 118 may be opposite to each other in the top view. In other words, the third membrane subpart 116 may be disposed by a first side (e.g., left side) of the sound producing cell 600 between the first membrane subpart 112 and the second membrane subpart 114 in the top view, the fourth membrane subpart 118 may be disposed by a second side (e.g., right side) of the sound producing cell 600 between the first membrane subpart 112 and the second membrane subpart 114 in the top view, and the first side and the second side of the sound producing cell 600 may be opposite to each other in the top view.

In FIG. 14, only one edge of the third membrane subpart 116 may be anchored by being connected to the anchor structure 120, only one edge of the fourth membrane subpart 118 may be anchored by being connected to the anchor structure 120, and other edges of the third membrane subpart 116 and other edges of the fourth membrane subpart 118 may be non-anchored and not connected to the anchor structure 120. Namely, a third anchored edge 116a of the third membrane subpart 116 may be an only one edge of the third membrane subpart 116 which is anchored, and a fourth anchored edge 118a of the fourth membrane subpart 118 is an only one edge of the fourth membrane subpart 118 which is anchored, wherein the third membrane subpart 116 may be directly connected to the anchor structure 120 through the third anchored edge 116a only, and the fourth membrane subpart 118 may be directly connected to the anchor structure 120 through the fourth anchored edge 118a only.

In FIG. 14, one second slit SL2 may be between the first membrane subpart 112 and the third membrane subpart 116 to define one second non-anchored edge 112n2 of the first membrane subpart 112 and one fifth non-anchored edge 116n5 of the third membrane subpart 116, another second slit SL2 may be between the first membrane subpart 112 and the fourth membrane subpart 118 to define another second non-anchored edge 112n2 of the first membrane subpart 112 and one sixth non-anchored edge 118n6 of the fourth membrane subpart 118, one third slit SL3 may be between the second membrane subpart 114 and the third membrane subpart 116 to define one fourth non-anchored edge 114n4 of the second membrane subpart 114 and another fifth non-anchored edge 116n5 of the third membrane subpart 116, and another third slit SL3 may be between the second membrane subpart 114 and the fourth membrane subpart 118 to define another fourth non-anchored edge 114n4 of the second membrane subpart 114 and another sixth non-anchored edge 118n6 of the fourth membrane subpart 118. In some embodiments, the fifth non-anchored edge 116n5 of the third membrane subpart 116 may be adjacent to the third anchored edge 116a of the third membrane subpart 116, and the sixth non-anchored edge 118n6 of the fourth membrane subpart 118 may be adjacent to the fourth anchored edge 118a of the fourth membrane subpart 118, but not limited thereto.

As shown in FIG. 14, the shape of the first membrane subpart 112 and the shape of the second membrane subpart 114 may substantially be trapezoids, the shape of the third membrane subpart 116 and the shape of the fourth membrane subpart 118 may substantially be triangles, the first membrane subpart 112 and the second membrane subpart 114 may be substantially congruent, and the third membrane subpart 116 and the fourth membrane subpart 118 may be substantially congruent, but not limited thereto.

During the operation of the sound producing cell 600, side openings are respectively between the first membrane subpart 112 and the third membrane subpart 116, between the second membrane subpart 114 and the third membrane subpart 116, between the first membrane subpart 112 and the fourth membrane subpart 118 and between the second membrane subpart 114 and the fourth membrane subpart 118. The size of the side opening is relative to a low frequency roll-off (LFRO) effect in the frequency response of the sound producing cell 600, wherein the strong LFRO effect may cause an evident SPL drop of the acoustic wave in the low frequency.

In detail, regarding the side opening of the sound producing cell 600, an acoustic resistance for low frequency may be according to a formula:

$$R \propto \frac{L}{b \times d^3},$$

wherein R is the acoustic resistance for low frequency, L is the thickness of the membrane 110, b is the length of the second non-anchored edge 112n2 of the first membrane subpart 112 or the length of the fourth non-anchored edge 114n4 of the second membrane subpart 114, and d is the maximum size of the side opening in the direction Z. If the acoustic resistance for low frequency is increased, the leakage of the air (e.g., acoustic leakage) in the operation of the sound producing cell 600 is decreased, so as to reduce the LFRO effect in the frequency response of the sound producing cell 600.

According to the formula, when d (i.e., the maximum size of the side opening in the direction Z) is decreased, the acoustic resistance for low frequency is increased. In the first embodiment shown in FIG. 1, regarding the first membrane subpart 112, the maximum size of the side opening in the direction Z is a maximum distance between the second non-anchored edge 112n2 and the anchor structure 120 in the direction Z. In the sixth embodiment shown in FIG. 14, regarding the first membrane subpart 112, the maximum size of the side opening in the direction Z is a maximum distance between the second non-anchored edge 112n2 of the first membrane subpart 112 and the fifth non-anchored edge 116n5 of the third membrane subpart 116 (or the sixth non-anchored edge 118n6 of the fourth membrane subpart 118) in the direction Z. In the sixth embodiment shown in FIG. 14, since the third membrane subpart 116 and the fourth membrane subpart 118 exist, d shown in the formula may be decreased by controlling the third membrane subpart 116 and the fourth membrane subpart 118 to be close to the first membrane subpart 112 and the second membrane subpart 114 in the direction Z during the operation of the sound producing cell 600. That is to say, in FIG. 14, the third membrane subpart 116 may be configured to reduce the acoustic leakage at the first side (left side) of the sound producing cell 600, and the fourth membrane subpart 118 is configured to reduce the acoustic leakage at the second side (right side) of the sound producing cell.

The sound producing cell 600 may include at least one suitable structure to make d (i.e., the maximum size of the side opening in the direction Z) decreased, thereby enhancing the acoustic resistance for low frequency. In this embodiment, due to this suitable structure, during the operation of the sound producing cell 600, the fifth non-anchored edges 116n5 of the third membrane subpart 116 may be respectively close to the second non-anchored edge 112n2 of the first membrane subpart 112 and the fourth non-anchored edge 114n4 of the second membrane subpart 114 in the direction Z, and the sixth non-anchored edges 118n6 of the fourth membrane subpart 118 may be respectively close to the second non-anchored edge 112n2 of the first membrane subpart 112 and the fourth non-anchored edge 114n4 of the second membrane subpart 114 in the direction Z. Accordingly, during the operation of the sound producing cell 600, the sizes of the side openings may be reduced, so as to enhance the acoustic resistance for low frequency, thereby reducing the LFRO effect in the frequency response of the sound producing cell 600.

For example, in order to make d decreased, the membrane 110 may include at least one spring connected between the subparts of membrane 110, such that the non-anchored edges of these subparts may be close to each other in the direction Z during the operation of the sound producing cell 600. As shown in FIG. 14, the membrane 110 may include at least one second spring SPR2 and at least one third spring SPR3, the second spring SPR2 may be directly connected between the first membrane subpart 112 and the third membrane subpart 116 or directly connected between the first membrane subpart 112 and the fourth membrane subpart 118, and the third spring SPR3 may be directly connected between the second membrane subpart 114 and the third membrane subpart 116 or between the second membrane subpart 114 and the fourth membrane subpart 118. In FIG. 14, the membrane 110 may include two second springs SPR2 and two third springs SPR3, two second springs SPR2 may be respectively connected between the first membrane subpart 112 and the third membrane subpart 116 and between the first membrane subpart 112 and the fourth membrane subpart 118, and two third springs SPR3 may be respectively connected between the second membrane subpart 114 and the third membrane subpart 116 and between the second membrane subpart 114 and the fourth membrane subpart 118, but not limited thereto. Note that the second spring SPR2 and the third spring SPR3 are formed because of the slits SL (e.g., the slits SL other than the first slit SL1, the second slits SL2 and the third slits SL3).

In addition, in one spring shown in FIG. 14, the connecting direction from this spring to one subpart may be the same as the connecting direction from this spring to another subpart, but not limited thereto. For example, in FIG. 14, the spring may substantially be a U-shape, but not limited thereto. For example, the U-shape of the spring may have a great curvature, but not limited thereto. Due to this design, the size of the side opening between two subparts may be decreased (i.e., d is decreased), so as to reduce the leakage of the air in the operation of the sound producing cell 600, thereby reducing the LFRO effect in the frequency response of the sound producing cell 600.

For example, in order to make d decreased, the actuating layer 130 may be disposed on the first membrane subpart 112, the second membrane subpart 114, the third membrane subpart 116 and the fourth membrane subpart 118. During the operation of the sound producing cell 600, the actuating layer 130 may actuate these subparts to move along the direction Z, such that the non-anchored edges of these subparts may be close to each other in the direction Z.

Moreover, in the region R3 shown in FIG. 15, the sound producing cell 600 may include a recess structure RS outside the membrane 110, wherein the recess structure RS may be directly connected to a slit segment SLs in the corner region CR of the membrane 110, and the recess structure RS may have a curved pattern (e.g., the recess structure RS may have a pattern with a half circular arc). For example, in FIG. 15, the slit segment SLs may be connected between the end of the second slit SL2 situated in the corner region CR and the recess structure RS, and the slit segment SLs may have a straight pattern, but not limited thereto. The existence of the curved recess structure RS connected to the slit segment SLs situating in the corner region CR may enhance the success rate of the manufacturing process of the sound producing cell 600, thereby increasing the yield rate of the sound producing cell 600.

Figure 16:
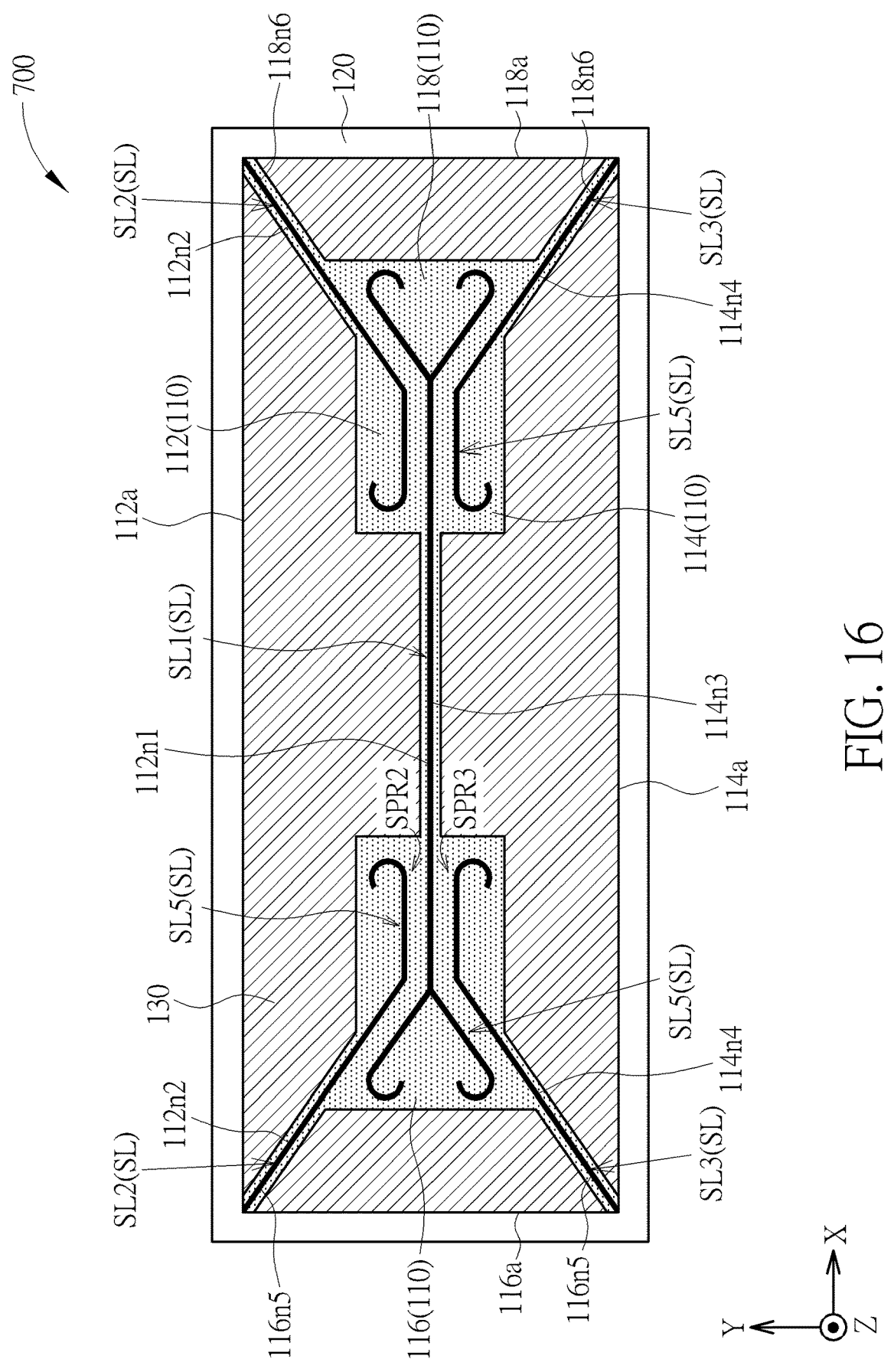

Referring to FIG. 16, FIG. 16 is a schematic diagram of a top view illustrating a sound producing cell according to a seventh embodiment of the present invention. As shown in FIG. 16, a difference between this embodiment and the sixth embodiment is the design of the spring. In the sound producing cell 700 shown in FIG. 16, the fifth slits SL5 including a hook-shaped curved pattern and a straight pattern may be individually connected to the first slit SL1, the second slit SL2 or the third slit SL3, and the second springs SPR2 and the third springs SPR3 may be formed because of the first slit SL1, the second slits SL2, the third slits SL3 and the fifth slits SL5, but not limited thereto. Furthermore, in FIG. 16, the spring may substantially be a V-shape, but not limited thereto.

Figure 17:
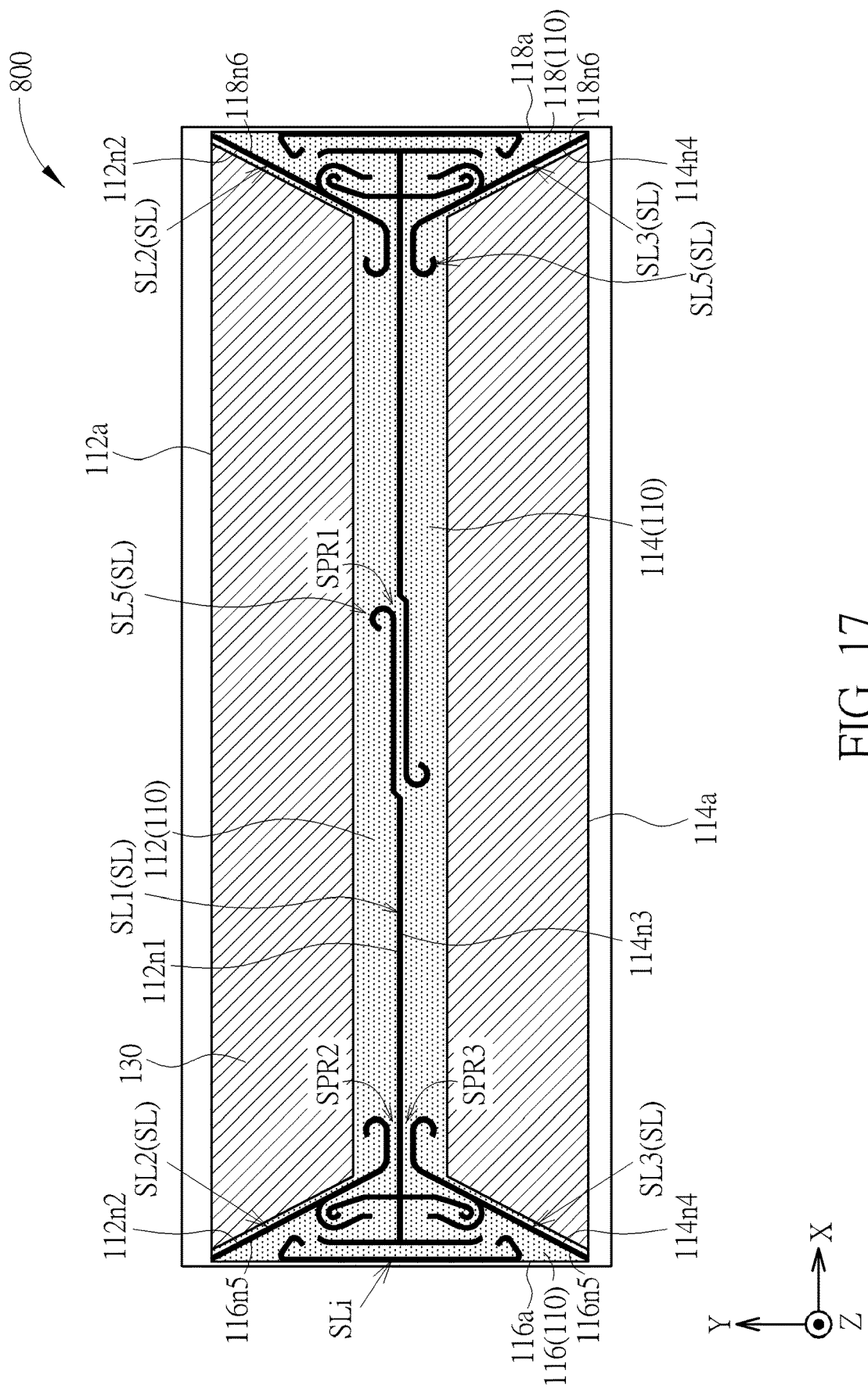
FIG. 17 is a schematic diagram of a top view illustrating a sound producing cell according to an eighth embodiment of the present invention.

Referring to FIG. 17, FIG. 17 is a schematic diagram of a top view illustrating a sound producing cell according to an eighth embodiment of the present invention. As shown in FIG. 17, a difference between this embodiment and the sixth embodiment is that the slits SL of the membrane 110 of the sound producing cell 800 further includes at least one side slit SLi formed on the third membrane subpart 116 and/or the fourth membrane subpart 118.

Due to the existence of the side slits SLi, the structural strengths of the third membrane subpart 116 and the fourth membrane subpart 118 may be weakened, such that the second spring SPR2 and the third spring SPR3 may pull the third membrane subpart 116 and the fourth membrane subpart 118 to make their the non-anchored edges be closer to the non-anchored edges of the first membrane subpart 112 and the second membrane subpart 114 in the direction Z during the operation of the sound producing cell 800.

On the other hand, compared with the structure which the side slit SLi does not exist, the membrane 110 of this embodiment may form a plurality smaller openings replacing one original greater opening between two non-anchored edges of the subparts during the operation of the sound producing cell 800, wherein at least one smaller openings may be formed between two non-anchored edges, and at least one smaller opening may be formed by side slit(s) SLi. Namely, d of the original greater opening is changed to a plurality of d' of the smaller openings, and d' is smaller than d. For example, according to above formula, assuming that one original greater opening is replaced by three smaller openings and d of the original greater opening is three times greater than d' of the smaller opening, the acoustic resistance of three smaller openings is nine times greater than the acoustic resistance of the original greater opening. Thus, the acoustic resistance for low frequency may be increased by this design.

As shown in FIG. 17, the second spring SPR2 may be formed because of the first slit SL1, the second slit SL2, the fifth slit SL5 and the side slit(s) SLi, and the third spring SPR3 may be formed because of the first slit SL1, the third slit SL3, the fifth slit SL5 and the side slit(s) SLi, but not limited thereto.

In some embodiments, as shown in FIG. 17, the actuating layer 130 may be disposed on the first membrane subpart 112 and the second membrane subpart 114, and the actuating layer 130 may be not disposed on the third membrane subpart 116 and the fourth membrane subpart 118 (i.e., no actuating layer is disposed on the third membrane subpart 116 and the fourth membrane subpart 118), but not limited thereto.

Moreover, in FIG. 17, the membrane 110 may optionally include a first spring SPR1 directly connected between the first membrane subpart 112 and the second membrane subpart 114. For example, the first spring SPR1 shown in FIG. 17 may be formed because of two first slits SL1 and two fifth slits SL5, but not limited thereto.

Figure 18:
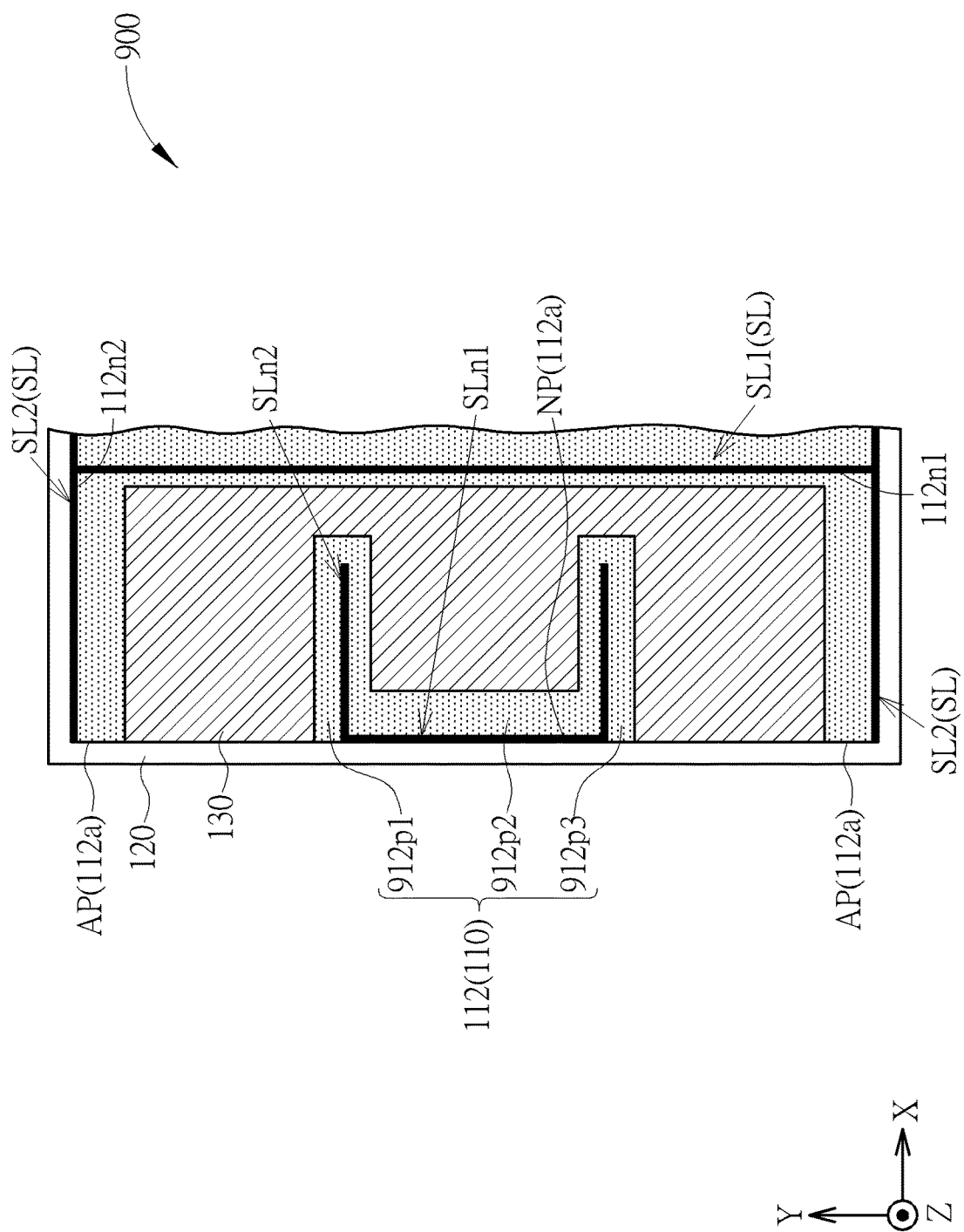
FIG. 18 is a schematic diagram of a top view illustrating a sound producing cell according to a ninth embodiment of the present invention.
Figure 19:
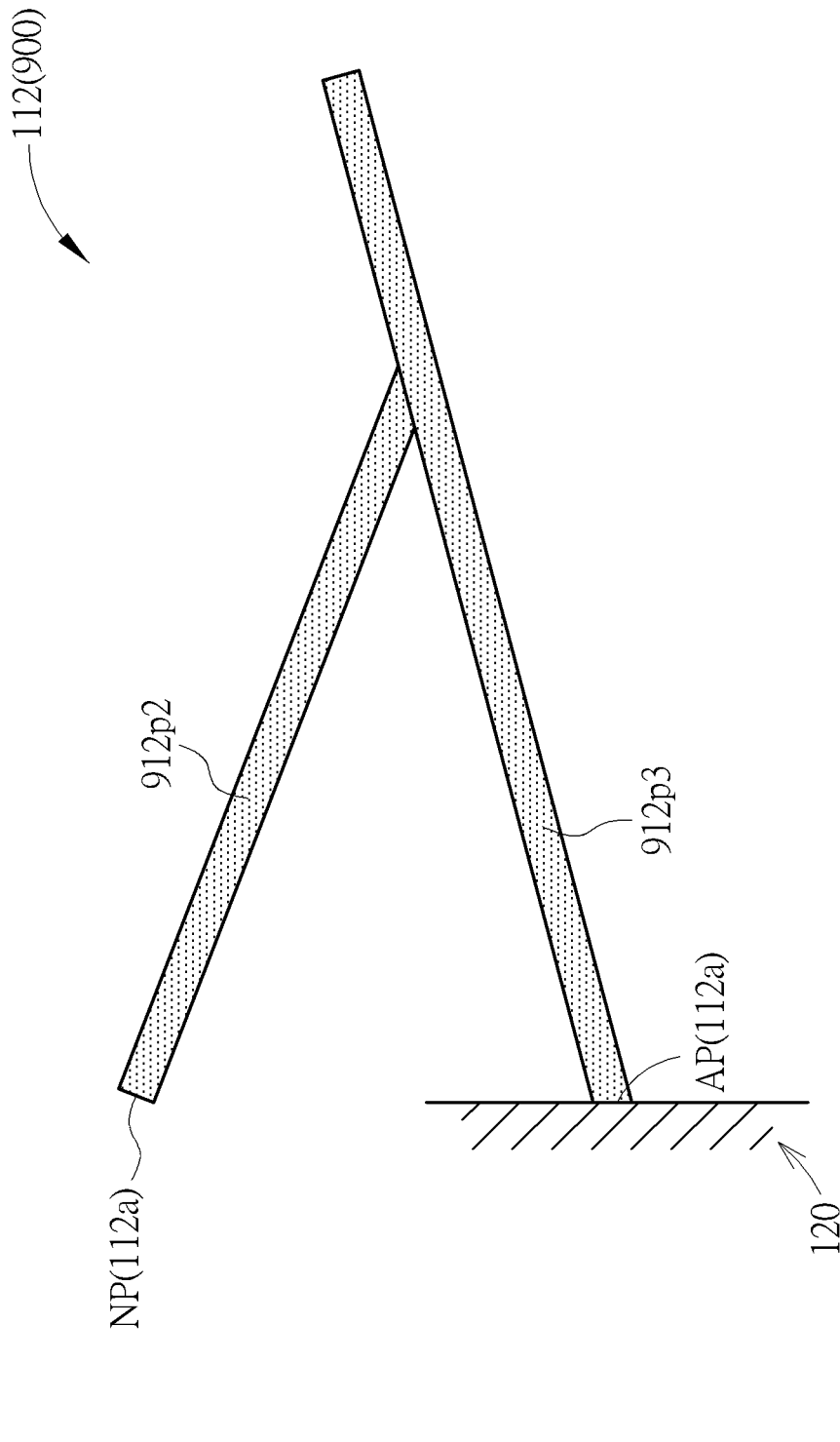
FIG. 19 is a schematic diagram of a side view illustrating the sound producing cell according to the ninth embodiment of the present invention.

Referring to FIG. 18 and FIG. 19, FIG. 18 is a schematic diagram of a top view illustrating a sound producing cell according to a ninth embodiment of the present invention, and FIG. 19 is a schematic diagram of a side view illustrating the sound producing cell according to the ninth embodiment of the present invention, wherein FIG. 18 and FIG. 19 only show the first membrane subpart 112, and the design of the second membrane subpart 114 may be similar to the design of the first membrane subpart 112. As shown in FIG. 18, a difference between this embodiment and the first embodiment is the design of the anchored edge of the subpart of the membrane 110. In the sound producing cell 900 of this embodiment, the anchored edge of the subpart of the membrane 110 is partially anchored, such that the anchored edge includes at least one anchored part and at least one non-anchored part, wherein the anchored part of the anchored edge is anchored, and the non-anchored part of the anchored edge is non-anchored. For example, in FIG. 18, the first anchored edge 112a of the first membrane subpart 112 which is partially anchored may include two anchored parts AP and one non-anchored part NP between two anchored parts AP, but not limited thereto. The non-anchored part NP of the first anchored edge 112a may move toward the direction Z when the sound producing cell 900 is operated (i.e., the first membrane subpart 112 is actuated), so as to enhance the deformation of the membrane 110, thereby increasing the SPL of the acoustic wave produced by the sound producing cell 900.

In order to make the anchored edge have the anchored part(s) AP and the non-anchored part(s) NP, the slits SL of the membrane 110 may include at least one inner slit. In this embodiment, the first membrane subpart 112 may have at least one first inner slit SLn1 and at least one second inner slit SLn2, wherein the non-anchored part NP of the first anchored edge 112a may be defined by the first inner slit SLn1, and the second inner slit SLn2 is connected to the first inner slit SLn1, so as to make the first anchored edge 112a have the anchored part(s) AP and the non-anchored part(s) NP. Namely, the first inner slit SLn1 may be parallel to the first anchored edge 112a and between the first membrane subpart 112 and the anchor structure 120, and the second inner slit SLn2 may be not parallel to the first anchored edge 112a. For example, in FIG. 18, the first membrane subpart 112 may have one first slit SL1 and two second slits SL2, and the second inner slit SLn2 may be a straight slit perpendicular to the first anchored edge 112a, but not limited thereto. For example, the second inner slit SLn2 may extend from the first anchored edge 112a toward the first slit SL1, and the second inner slit SLn2 may not be connected to the first slit SL1.

The first inner slit SLn1 defining the non-anchored part NP of the first anchored edge 112a may be connected between two slits SL. For example, in FIG. 18, the first inner slit SLn1 may be connected between two second inner slits SLn2, such that the anchored part AP and the non-anchored part NP of the first anchored edge 112a may be divided by the second inner slit SLn2, but not limited thereto.

Optionally, in FIG. 18, the first inner slit SLn1 and the second inner slit SLn2 may be separated from the first slit SL1, the second slit SL2 and the third slit SL3, but not limited thereto.

As shown in FIG. 18, the first membrane subpart 112 may be divided into a plurality of parts by the inner slits SL. For example, in FIG. 18, the first membrane subpart 112 may be divided into three parts 912p1, 912p2 and 912p3, the part 912p1 and the part 912p3 may be between the second slit SL2 and the second inner slit SLn2, and the part 912p2 may be between two second inner slits SLn2. For example, in FIG. 18, the part 912p1 and the part 912p3 may have the anchored part AP of the first anchored edge 112a, so as to be anchored by the anchor structure 120. For example, in FIG. 18, the part 912p2 may have the non-anchored part NP of the first anchored edge 112a, such that the part 912p2 may move along the direction Z with greater displacement (compared with the parts 912p1 and 912p3) during the operation of the sound producing cell 900, thereby increasing the SPL of the acoustic wave produced by the sound producing cell 900.

As shown in FIG. 18, the actuating layer 130 may include three portions respectively disposed on three parts 912p1, 912p2 and 912p3 of the first membrane subpart 112, so as to actuate the first membrane subpart 112.

In FIG. 19 showing the side view of the sound producing cell 900 during its operation, the part 912p2 may move along the direction Z with greater displacement (compared with the parts 912p1 and 912p3) during the operation of the sound producing cell 900, and the non-anchored part NP of the first anchored edge 112a may be higher than the anchored part AP in the direction Z.

Figure 20:
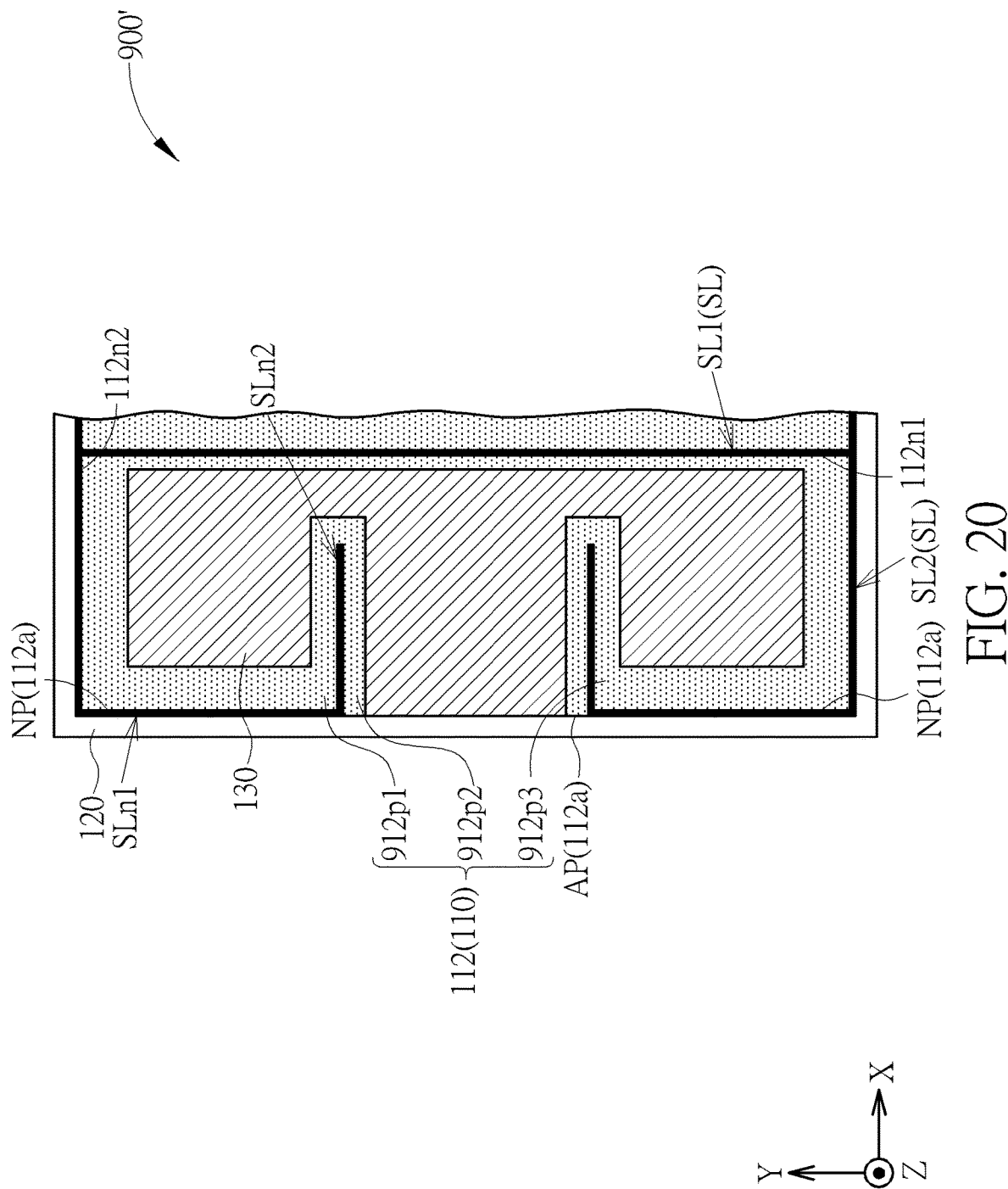
FIG. 20 is a schematic diagram of a top view illustrating a sound producing cell according to a tenth embodiment of the present invention.

Referring to FIG. 20, FIG. 20 is a schematic diagram of a top view illustrating a sound producing cell according to a tenth embodiment of the present invention. As shown in FIG. 20, a difference between this embodiment and the ninth embodiment is the design of the anchored edge of the subpart of the membrane 110. In the sound producing cell 900' shown in FIG. 20, the first anchored edge 112a of the first membrane subpart 112 may include two non-anchored parts NP and one anchored part AP between two non-anchored parts NP, but not limited thereto. In FIG. 20, the first membrane subpart 112 may have two first inner slits SLn1 and two second inner slits SLn2, and the first inner slit SLn1 may be connected between the second inner slit SLn2 and the second slit SL2, but not limited thereto.

In FIG. 20, the part 912p2 may have the anchored part AP of the first anchored edge 112a, so as to be anchored by the anchor structure 120. In FIG. 20, the part 912p1 and the part 912p3 may have the non-anchored part NP of the first anchored edge 112a, such that the part 912p1 and the part 912p3 may move along the direction Z with greater displacement (compared with the part 912p2) during the operation of the sound producing cell 900', thereby increasing the SPL of the acoustic wave produced by the sound producing cell 900'.

In summary, according to the design of the sound producing cell of the present invention, the sound producing cell may achieve higher resonant frequency, larger SPL, high yield rate and/or low air leakage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a sound producing cell, comprising:
   providing a wafer comprising a first layer and a second layer;
   patterning the first layer of the wafer, so as to form at least one trench line;
   disposing the wafer on a substrate;
   wherein the first layer comprises a membrane, and at least one slit is formed within and penetrates through the membrane because of the at least one trench line;
   wherein the membrane comprises a first membrane subpart and a second membrane subpart, wherein the first membrane subpart and the second membrane subpart are opposite to each other;
   wherein the first membrane subpart comprises a first anchored edge which is fully or partially anchored, and edges of the first membrane subpart other than the first anchored edge are non-anchored;
   wherein the second membrane subpart comprises a second anchored edge which is fully or partially anchored, and edges of the second membrane subpart other than the second anchored edge are non-anchored.

2. The manufacturing method of claim 1, further comprising:
   forming a recess structure at a corner of the sound producing cell.

3. The manufacturing method of claim 1, further comprising:

patterning the first layer of the wafer, such that the membrane further comprises a third membrane subpart and a fourth membrane subpart;

wherein the third membrane subpart is configured to reduce acoustic leakage at a first side of the sound producing cell;

wherein the fourth membrane subpart is configured to reduce acoustic leakage at a second side of the sound producing cell.

4. The manufacturing method of claim 1, further comprising:

patterning the first layer of the wafer, such that the membrane further comprises a third membrane subpart and a spring;

wherein the third membrane subpart is configured to reduce acoustic leakage at a first side of the sound producing cell;

wherein the spring is directly connected between the first membrane subpart and the third membrane subpart.

* * * * *